(12) United States Patent
Nishimura

(10) Patent No.: US 11,800,658 B2
(45) Date of Patent: Oct. 24, 2023

(54) DISPLAY DEVICE

(71) Applicant: Japan Display Inc., Tokyo (JP)

(72) Inventor: Masumi Nishimura, Tokyo (JP)

(73) Assignee: Japan Display Inc., Tokyo (JP)

( * ) Notice: Subject to any disclaimer, the term of this patent is extended or adjusted under 35 U.S.C. 154(b) by 186 days.

(21) Appl. No.: 17/462,533

(22) Filed: Aug. 31, 2021

(65) Prior Publication Data

US 2022/0071032 A1 Mar. 3, 2022

(30) Foreign Application Priority Data

Aug. 31, 2020 (JP) ................. 2020-145551

(51) Int. Cl.
| | |
|---|---|
| *H05K 5/02* | (2006.01) |
| *H05K 5/00* | (2006.01) |
| *B32B 3/18* | (2006.01) |
| *B32B 3/04* | (2006.01) |
| *B32B 7/022* | (2019.01) |

(52) U.S. Cl.
CPC ............ *H05K 5/0217* (2013.01); *B32B 3/04* (2013.01); *B32B 3/18* (2013.01); *B32B 7/022* (2019.01); *B32B 2307/51* (2013.01); *B32B 2457/20* (2013.01)

(58) Field of Classification Search
CPC .......................... H05K 5/0217; H05K 5/0017
USPC ........................................... 428/212
See application file for complete search history.

(56) References Cited

U.S. PATENT DOCUMENTS

| | | |
|---|---|---|
| 2014/0321074 A1 | 10/2014 | Chida et al. |
| 2015/0062525 A1* | 3/2015 | Hirakata ............... G06F 1/1652 |
| | | 349/158 |
| 2020/0042042 A1 | 2/2020 | Park et al. |
| 2020/0089273 A1 | 3/2020 | Watamura |
| 2020/0305294 A1 | 9/2020 | Yamaguchi et al. |

FOREIGN PATENT DOCUMENTS

| | | | |
|---|---|---|---|
| CN | 110933881 A | * | 3/2020 |
| JP | 2020-3817 A | | 1/2020 |
| JP | 2020-8881 A | | 1/2020 |
| JP | 2020-21073 A | | 2/2020 |
| JP | 2020-24420 A | | 2/2020 |
| JP | 2020-46541 A | | 3/2020 |
| WO | WO 2019/117050 A1 | | 6/2019 |

OTHER PUBLICATIONS

Machine_english_translation_CN_11093881_A; Chen Liang; Shell assembly for electronic equipment and electronic equipment; Mar. 27, 2020; EPO; whole document (Year: 2023).*

* cited by examiner

*Primary Examiner* — Tahseen Khan

(74) *Attorney, Agent, or Firm* — Maier & Maier, PLLC

(57) ABSTRACT

A display device according to an embodiment includes a bendable housing, a flexible display module, a flexible external frame, and an internal frame. The display module includes a first surface facing the housing, a second surface opposite to the first surface, and a side surface connecting the first and second surfaces. The external frame has a base end portion connected to the housing and an edge portion integrally formed with the base end portion and facing the second surface, and covers the display module. The internal frame is arranged between the base end portion and the side surface, and has a Young's modulus larger than that of the external frame.

9 Claims, 18 Drawing Sheets

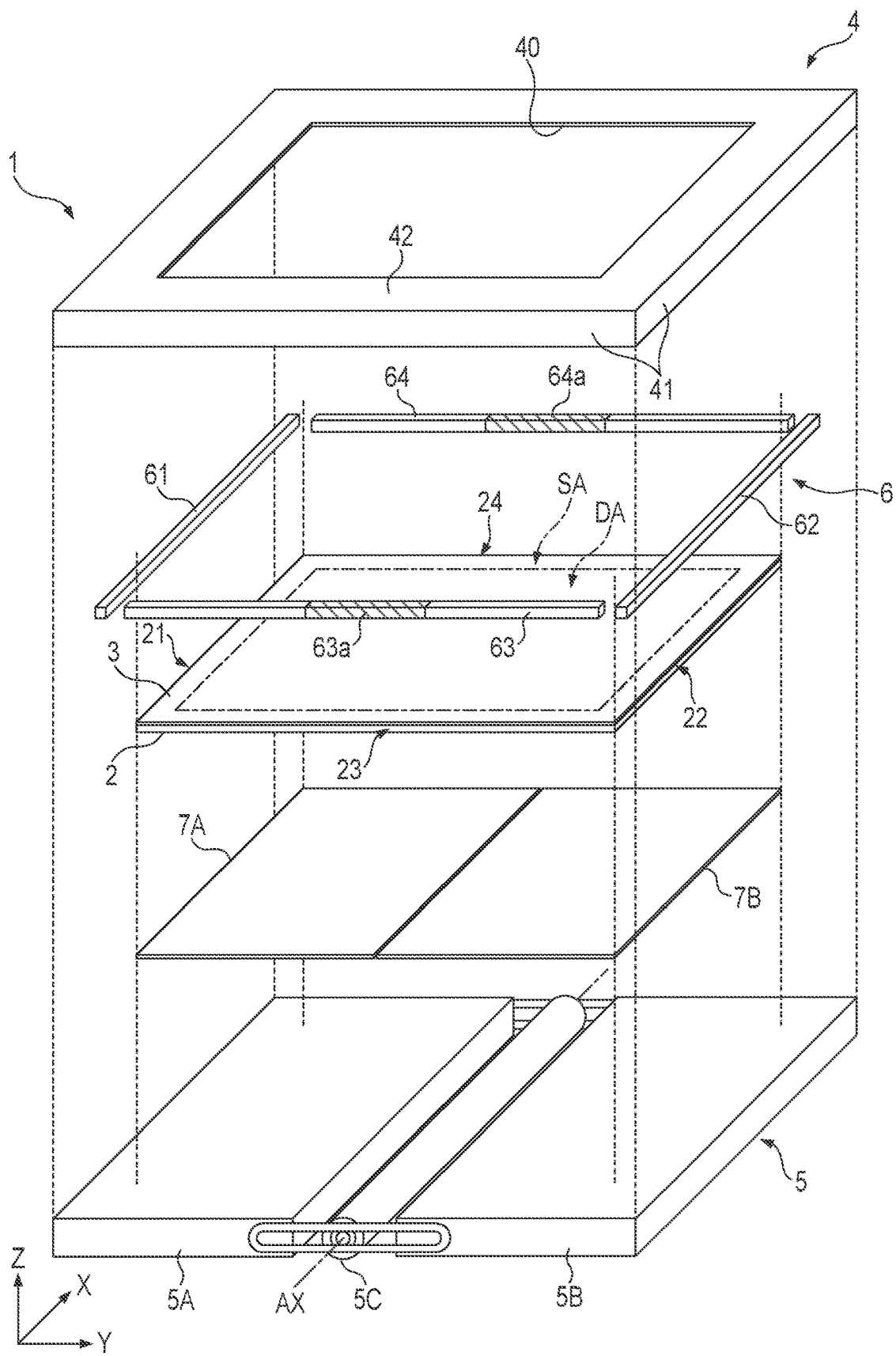
F I G. 15

DISPLAY DEVICE

CROSS-REFERENCE TO RELATED APPLICATIONS

This application is based upon and claims the benefit of priority from Japanese Patent Application No. 2020-145551, filed Aug. 31, 2020, the entire contents of which are incorporated herein by reference.

FIELD

Embodiments described herein relate generally to a display device.

BACKGROUND

In recent years, a display device capable of folding or expanding a display surface by mounting a flexible display module has been developed. This type of display device is excellent in portability in a folded state, and can give a user a high sense of use in an expanded state.

In the above display device, when a frame having high rigidity is bonded to an edge portion of the display module as in a general display device, smooth deformation of the display module is hindered, and a bending resistance is deteriorated. To address this, when a gap is provided between the frame and the edge portion of the display module, the dustproofness and waterproofness of the display device are reduced.

BRIEF DESCRIPTION OF THE DRAWINGS

FIG. 15 is a schematic exploded perspective view of a display device according to a third embodiment.

DETAILED DESCRIPTION

Figure 1:
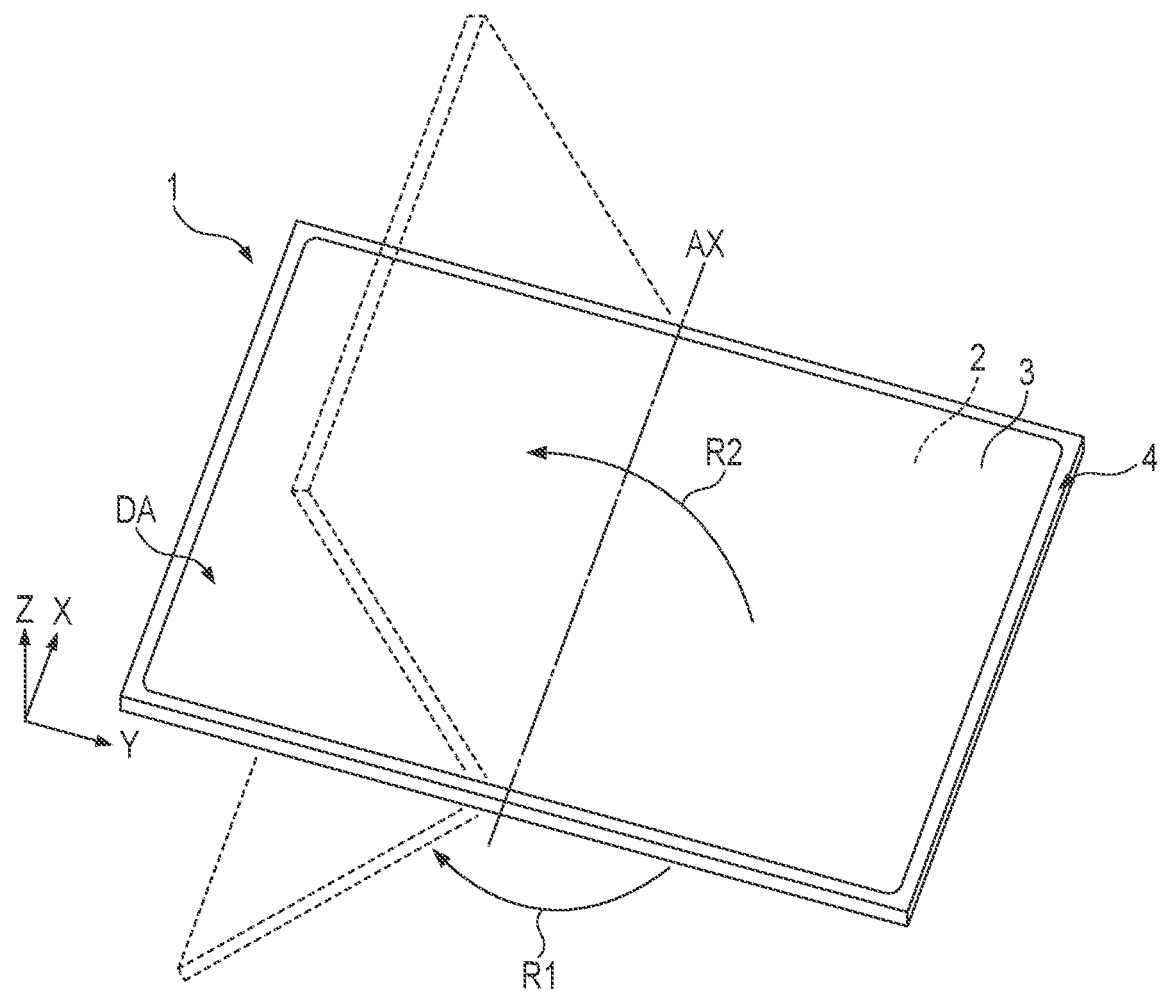
FIG. 1 is a schematic perspective view of a display device according to a first embodiment.

In general, according to embodiments, a display device includes a bendable housing, a flexible display module, a flexible external frame, and an internal frame. The display module includes a first surface facing the housing, a second surface opposite to the first surface, and a side surface connecting the first surface and the second surface. The external frame has a base end portion connected to the housing and an edge portion integrally formed with the base end portion and facing the second surface, and covers the display module. The internal frame is arranged between the base end portion and the side surface, and has a Young's modulus larger than that of the external frame.

According to the above configuration, it is possible to provide a display device capable of achieving both bending resistance, and dustproofness and waterproofness.

Some embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the drawings may be more schematic than in the actual modes, but they are mere examples, and do not limit the interpretation of the present invention. In the drawings, reference numbers of continuously arranged elements equivalent or similar to each other are omitted in some cases. In addition, in the specification and drawings, the same elements as those described in connection with preceding drawings are denoted by like reference numbers, and detailed description thereof is omitted unless necessary.

First Embodiment

FIG. 1 is a schematic perspective view of a display device 1 according to a first embodiment. The display device 1 is, for example, an electronic device such as a smartphone or a tablet having a flat shape as illustrated, but may be another type of device.

In this embodiment, an X direction, a Y direction, and a Z direction are defined as illustrated. The X direction, the Y direction, and the Z direction are orthogonal to each other, but may intersect at an angle other than 90°. Hereinafter, viewing the display device 1 along the Z direction is referred to as a plan view.

The display device 1 includes a display module 2 which displays an image, a cover member 3 which covers the display module 2, and an external frame 4 which surrounds the periphery of the display module 2. The cover member 3 can also be referred to as a cover film or a protective film.

The type of the display element included in the display module 2 is not particularly limited. However, in one example, a liquid crystal display element, an organic electroluminescence (EL) display element, a light emitting diode (LED), or the like can be used. In a case where the display module 2 has a liquid crystal display element, a backlight including a light guide plate and a light source may be included in the display module 2. Further, an optical film such as a polarizing film or a diffusion film may be included in the display module 2. In a case where the display module 2 has an LED as the display element, the LED may be, for example, a micro LED in which the length of the longest side is 100 µm or less, a mini LED in which the length of the longest side is more than 100 µm and less than 300 µm, or an LED in which the length of the longest side is 300 µm or more.

In the illustrated example, the shape of the display module 2 in plan view is a rectangle having a pair of short sides along the X direction and a pair of long sides along the Y direction. The external frame 4 has a frame shape having a rectangular opening. An area surrounded by the external frame 4 corresponds to a display area DA including a plurality of pixels.

In this embodiment, elements, such as the display module 2, the cover member 3, and the external frame 4, of the display device 1 are flexible. Accordingly, the display device 1 can be bent in an opening direction R1 and a closing direction R2 with a bending axis AX as a starting point.

For example, in a case where the display device 1 is bent in the opening direction R1 until both short sides parallel to the X direction come close to each other, the display area DA appears on both surfaces of the display device 1. On the other hand, in a case where the display device 1 is bent in the closing direction R2 until these short sides come close to each other, the display device 1 is closed such that the display area DA cannot be visually recognized from the outside.

In order to realize the foldable display device 1 as described above, a technique of neutral plane separation is used in a laminate including the display module 2 and the cover member 3. Hereinafter, neutral plane separation will be described with reference to FIGS. 2 and 3.

Figure 2:
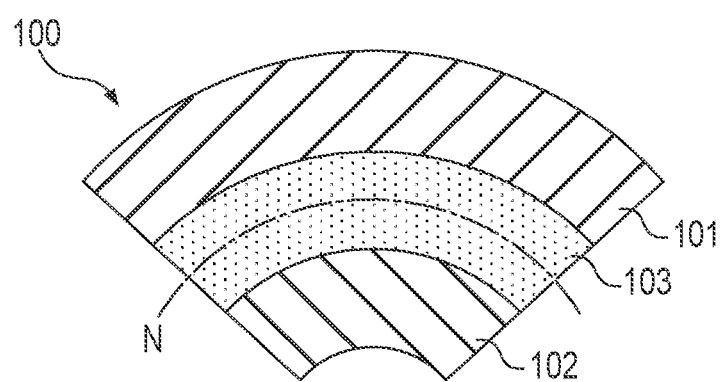
FIG. 2 is a schematic cross-sectional view illustrating a part of a bent laminate.
Figure 3:
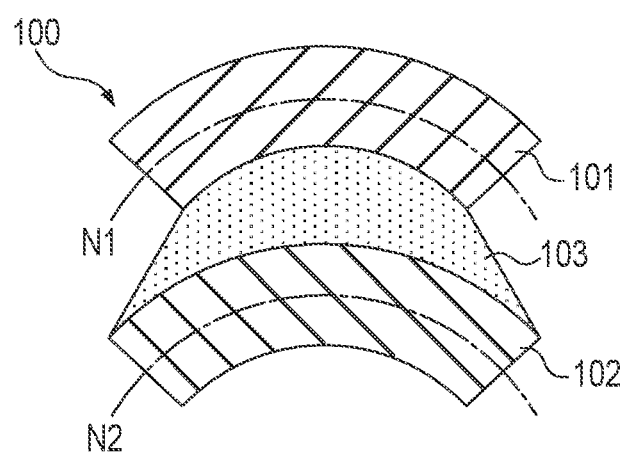
FIG. 3 is a schematic cross-sectional view illustrating a part of the laminate subjected to neutral plane separation.

FIGS. 2 and 3 are schematic cross-sectional views illustrating a part of a bent laminate 100. The laminate 100 includes a first film 101, a second film 102, and an adhesive layer 103 for bonding these films 101 and 102. In both FIGS. 2 and 3, the laminate 100 is bent such that the first film 101 is positioned on the outer side, and the second film 102 is positioned on the inner side.

In FIG. 2, since the films 101 and 102 is firmly bonded by the adhesive layer 103, the positions of the films 101 and 102 do not deviate from each other even when the laminate 100 is bent. In this case, the laminate 100 has a single neutral plane N. A tensile stress is applied to the laminate 100 on the outside of the neutral plane N in a bending direction, and a compressive stress is applied to the laminate 100 on the inside of the neutral plane N in the bending direction.

On the other hand, in FIG. 3, the adhesive layer 103 functions as a stress separation layer. That is, when the laminate 100 is bent, the films 101 and 102 slide against each other, and a stress is separated between the films 101 and 102. Accordingly, the first film 101 has a first neutral plane N1, and the second film 102 has a second neutral plane N2 different from the first neutral plane N1. In the first film 101, a tensile stress is applied to a portion positioned outside the first neutral plane N1 in the bending direction, and a compressive stress is applied to a portion positioned inside the first neutral plane N1 in the bending direction. In the second film 102, a tensile stress is applied to a portion positioned outside the second neutral plane N2 in the bending direction, and a compressive stress is applied to a portion positioned inside the second neutral plane N2 in the bending direction.

The tensile stress and the compressive stress acting on respective portions of the laminate 100 along with bending increase as the distance from the neutral plane increases in a thickness direction. That is, in a case where the neutral plane of the laminate 100 is separated into a plurality of surfaces, the compressive stress and tensile stress applied to the surface of the films 101 and 102 and the like are reduced. Accordingly, a force required to bend the laminate 100 is also reduced.

Next, problems that may occur in the display device to which the neutral plane separation is applied will be described with reference to FIGS. 4 and 5.

Figure 4:
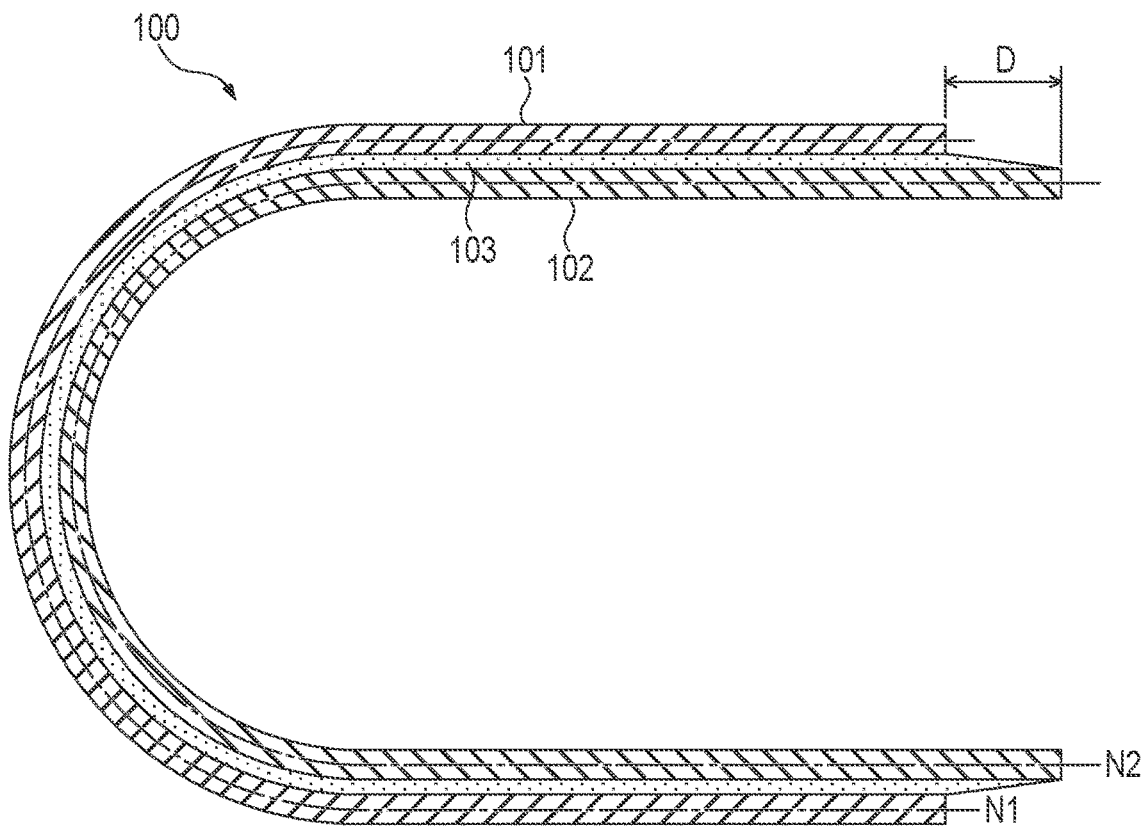
FIG. 4 is a schematic cross-sectional view illustrating the entire laminate subjected to the neutral plane separation.

FIG. 4 is a schematic cross-sectional view illustrating the entire laminate 100 subjected to the neutral plane separation. The first film 101 and the second film 102 have the same length in a state of being extended flat. In a state where the films 101 and 102 is subjected to the neutral plane separation, it can be considered that each of these films 101 and 102 is bent separately. In this case, the portion having a curvature in the first film 101 is longer than the portion having a curvature in the second film 102. Therefore, a deviation of a distance D between the end portions of the films 101 and 102 occurs.

Figure 5:
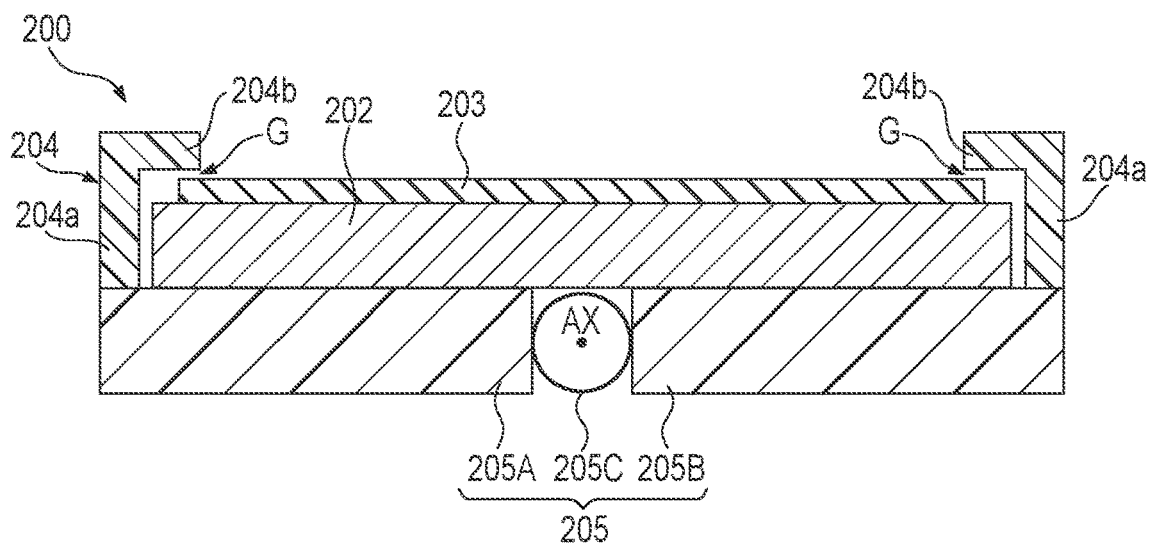
FIG. 5 is a schematic cross-sectional view of a display device according to a comparative example.

FIG. 5 is a schematic cross-sectional view of a display device 200 according to a comparative example with this embodiment. The display device 200 includes a display module 202, a cover member 203, a frame 204, and a housing 205. Both the display module 202 and the cover member 203 are flexible similarly to the display module 2 and the cover member 3 described above.

The housing 205 includes a plate-shaped first base 205A and a plate-shaped second base 205B, and a hinge 205C which rotatably connects the bases 205A and 205B around the bending axis AX. The back surface of the display module 202 is bonded to the bases 205A and 205B. The cover member 203 is bonded to the upper surface of the display module 202.

The frame 204 is formed of a rigid material which is difficult to bend, and has a base end portion 204a connected to the bases 205A and 205B and an edge portion 204b extending upward of the cover member 203.

In the display device 200 having such a configuration, when the bases 205A and 205B are rotated relative to each other, the display module 202 and the cover member 203 are bent. In a case where the above-described neutral plane separation technique is applied to the laminate including the display module 202 and the cover member 203, the end portions of the outer member and the inner member in the bending deviate from each other similarly to the example of FIG. 4. Therefore, in a case where the edge portion 204b of the rigid frame 204 and the laminate are bonded to each other, there is a possibility that the bending resistance of the display device 200 cannot be secured. On the other hand, when a gap G is provided between the edge portion 204b and the laminate as illustrated in FIG. 5, there is a possibility that dust and moisture enter the inside of the display device 200 through the gap G.

The display device 1 according to this embodiment has a structure capable of achieving both such bending resistance, and dustproofness and waterproofness. Hereinafter, the structure of the display device 1 will be described in detail.

Figure 6:
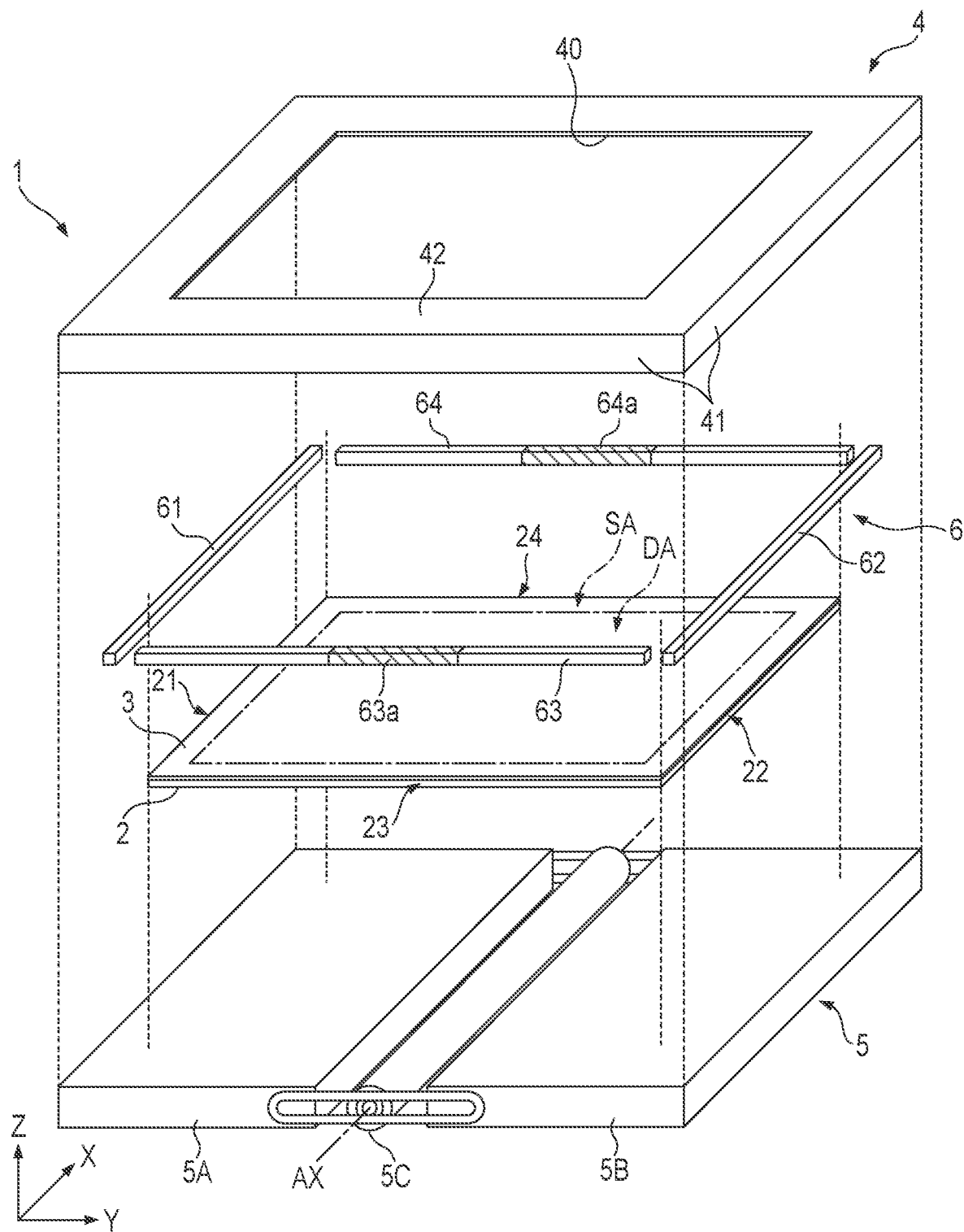
FIG. 6 is a schematic exploded perspective view of the display device according to the first embodiment.
Figure 7:
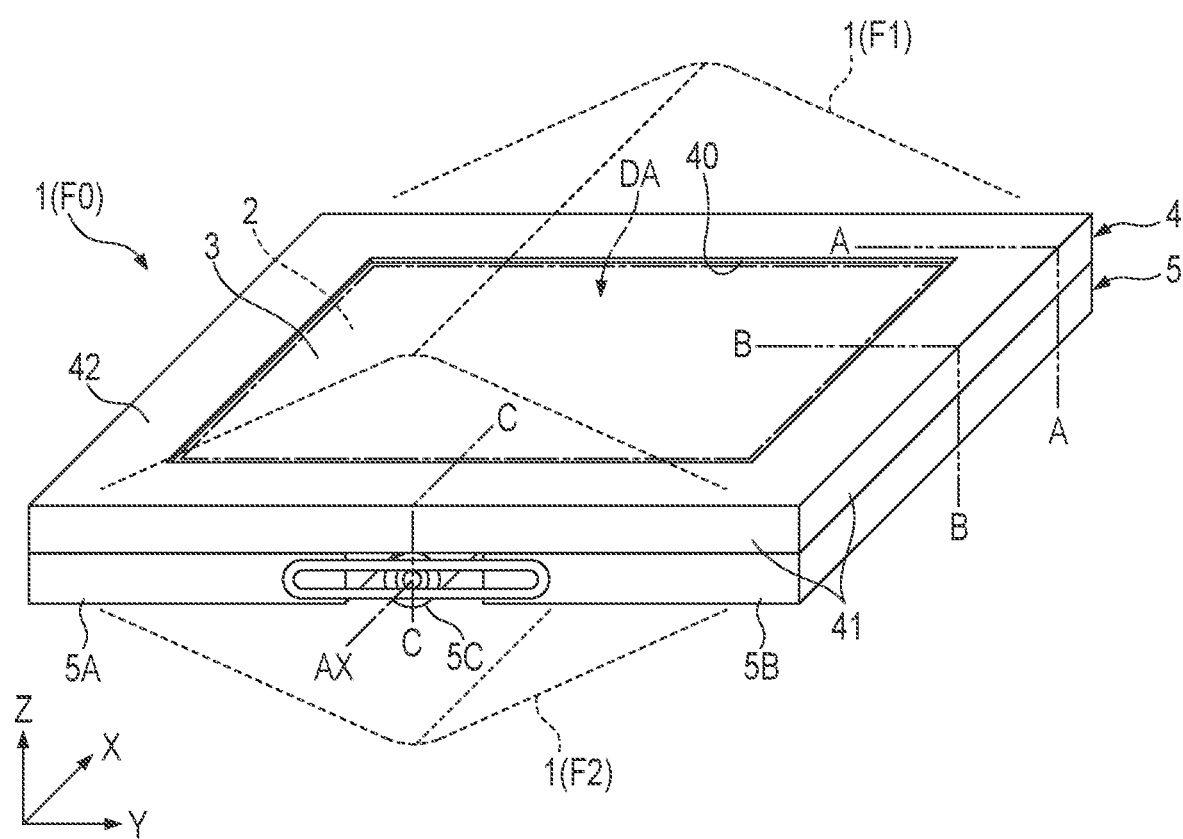
FIG. 7 is a schematic perspective view of the display device according to the first embodiment in an assembled state.

FIG. 6 is a schematic exploded perspective view of the display device 1. FIG. 7 is a schematic perspective view of the display device 1 in an assembled state. Incidentally, in these drawings, each part is more schematically illustrated as compared with FIG. 1 in order to facilitate the description.

As illustrated in FIG. 6, the display device 1 includes the display module 2, the cover member 3, and the external frame 4 described above. Further, the display device 1 includes a housing 5 and an internal frame 6.

The housing 5 has a plate-shaped first base 5A, a plate-shaped second base 5B, and a hinge 5C which connects the bases 5A and 5B so as to be rotatable about the bending axis AX. In the example of FIG. 6, the bending axis AX is parallel to the X direction. However, the bending axis AX may intersect with the X direction. Further, the position of the bending axis AX is not particularly limited, and may not be, for example, a position close to the center of the housing 5 in the Y direction as illustrated. The same applies to the examples illustrated in FIGS. 11, 15, 16, and the like described later. The configuration of the hinge 5C is not particularly limited, and, for example, may be formed such that a plurality of members for connecting the bases 5A and 5B are included as illustrated, or may be a flexible film-shaped member connected to the bases 5A and 5B.

The display module 2 has the above-described display area DA and a peripheral area SA around the display area DA. Further, the display module 2 has a first side surface 21 and a second side surface 22 parallel to the X direction, and a third side surface 23 and a fourth side surface 24 parallel to the Y direction. The cover member 3 is laminated in the Z direction with respect to the display module 2, and covers both the display area DA and the peripheral area SA. The laminate including the display module 2 and the cover member 3 is fixed to the bases 5A and 5B by an appropriate method such as adhesion. As the cover member 3, for example, a flexible and transparent film formed of a material such as polyethylene terephthalate (PET), cycloolefin polymer (COP), or polyimide can be used.

The internal frame 6 surrounds the display module 2 and the cover member 3 in a state where the display device 1 is assembled. Specifically, the internal frame 6 has a first portion 61, a second portion 62, a third portion 63, and a fourth portion 64 facing the first side surface 21, the second side surface 22, the third side surface 23, and the fourth side surface 24, respectively, in a state where the display device 1 is assembled. Each of the portions 61 to 64 can be formed of, for example, a resin material or a metal material.

In the example of FIG. 6, gaps are provided between the first portion 61 and the third portion 63, between the first portion 61 and the fourth portion 64, between the second portion 62 and the third portion 63, and between the second portion 62 and the fourth portion 64, respectively. As another example, at least any end portions of the portions 61 to 64 may be in contact with or connected to each other.

Each of the portion 61 to 64 of the internal frame 6 is attached to the housing 5 by an appropriate method. Since the first portion 61 and the second portion 62 do not intersect with the bending axis AX in plan view, the first portion 61 and the second portion 62 do not deform even when the bases 5A and 5B are rotated by the hinge 5C. In this regard, the first portion 61 and the second portion 62 may be fixed to the bases 5A and 5B by an appropriate method such as adhesion.

On the other hand, since the third portion 63 and the fourth portion 64 intersect with the bending axis AX in plan view, central areas 63a and 64a overlapping with the hinge 5C are deformed when the bases 5A and 5B are rotated by the hinge 5C. In order to facilitate this deformation, the third portion 63 and the fourth portion 64 are preferably attached to the housing 5 so as to be slidable in the Y direction. In this case, gaps may be formed between at least the central areas 63a and 64a of the third portion 63 and the fourth portion 64 and the housing 5.

As another example, the third portion 63 and the fourth portion 64 may be bonded to the bases 5A and 5B. In this case, it is preferable that the third portion 63 and the fourth portion 64 expand and contract so as not to deviate from the display module 2 when the display module 2 is deformed with the rotation of the bases 5A and 5B. The Young's moduli of the central areas 63a and 64a may be made smaller than the Young's moduli of the other areas of the third portion 63 and the fourth portion 64 so that the central areas 63a and 64a are mainly deformed when the bases 5A and 5B rotate.

The external frame 4 has a rectangular opening 40 having a size corresponding to the display area DA. Further, the external frame 4 has a base end portion 41 connected to the housing 5 in a state where the display device 1 is assembled, and an edge portion 42 around the opening 40. The base end portion 41 and the edge portion 42 are integrally formed. For example, the edge portion 42 has a frame shape parallel to the X direction and the Y direction, and overlaps with the portions 61 to 64 of the internal frame 6 and the peripheral area SA in the Z direction. The external frame 4 is formed of a flexible material such as rubber, and is deformed together with the display module 2 and the cover member 3 when the bases 5A and 5B rotate.

In this embodiment, each of the portion 61 to 64 of the internal frame 6 has higher rigidity than the external frame 4. Specifically, the Young's modulus of each of the portions 61 to 64 is larger than the Young's modulus of the external frame 4. The Young's modulus of the external frame 4 is preferably smaller than the Young's moduli of the display module 2 and the cover member 3 so that the deformation of the display module 2 and the cover member 3 is not hindered by the external frame 4.

In the example of FIG. 7, the entire display area DA is flat. Hereinafter, the shape of the display device 1 in this state is referred to as a flat shape F0. By rotating the bases 5A and 5B from the flat shape F0, the display device 1 can be deformed into an open shape F1 and a closed shape F2. The open shape F1 is a state (convex bending) in which the display device 1 is bent in the opening direction R1 illustrated in FIG. 1, and the closed shape F2 is a state (concave bending) in which the display device 1 is bent in the closing direction R2 illustrated in FIG. 1.

FIGS. BA, 8B, and BC are schematic cross-sectional views of the display device 1 having the flat shape F0 as viewed along lines A-A, B-B, and C-C illustrated in FIG. 7, respectively. As illustrated in each drawing, the display module 2 has a lower surface 2a (first surface) facing the housing 5 and an upper surface 2b (second surface) opposite to the lower surface 2a. The cover member 3 has a lower surface 3a (third surface) facing the upper surface 2b and an upper surface 3b (fourth surface) opposite to the lower surface 3a. The edge portion 42 of the external frame 4 has a lower surface 42a facing the upper surfaces 2b and 3b and an upper surface 42b opposite to the lower surface 42a.

The base end portion 41 of the external frame 4 has a first end portion 41a and a second end portion 41b. The base end portion 41 is connected to the housing 5 by an appropriate method such as adhesion. For example, as illustrated, the first end portion 41a may be connected to the upper surface of the housing 5 (base 5A and 5B), or the side surface of the base end portion 41 may be connected to the side surface of the housing 5. The second end portion 41b is connected to the edge portion 42. The lower surface 42a of the edge portion 42 is bonded to the upper surface 3b of the cover member 3 by a first adhesive layer AD11.

The lower surface 3a of the cover member 3 is bonded to the upper surface 2b of the display module 2 by a second adhesive layer AD12. The lower surface 2a of the display module 2 is bonded to the housing 5 by a third adhesive layer AD13. Other members may be interposed between the housing 5 and the display module 2, between the display module 2 and the cover member 3, and between the cover member 3 and the edge portion 42.

The Young's moduli of the adhesive layers AD11 to AD13 are preferably smaller than the Young's moduli of the display module 2 and the cover member 3. Accordingly, the deformation of the display module 2 and the cover member 3 is less likely to be hindered by the adhesive layers AD11 to AD13.

Figure 8A:
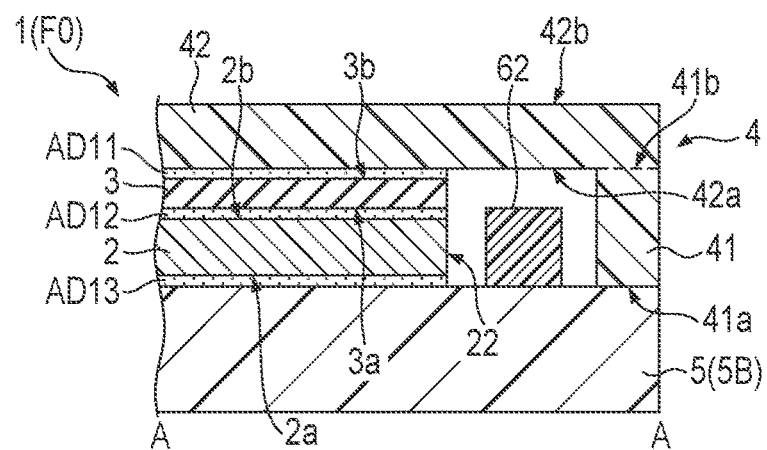
FIG. 8A is a schematic cross-sectional view of the display device in a flat shape illustrated in FIG. 7 as viewed along line A-A.
Figure 8B:
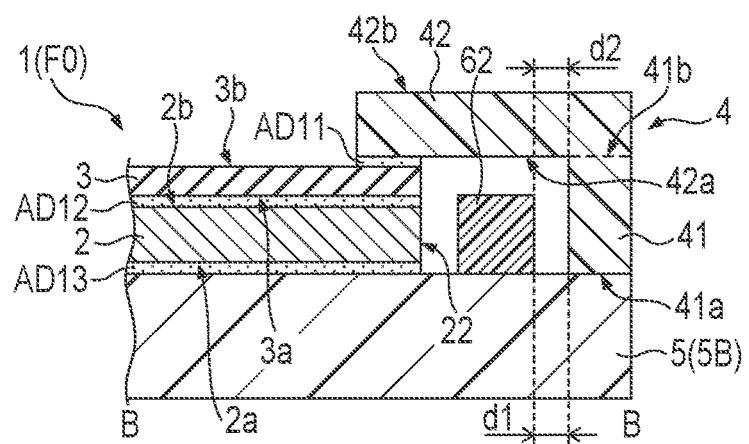
FIG. 8B is a schematic cross-sectional view of the display device in the flat shape illustrated in FIG. 7 as viewed along line B-B.

As illustrated in FIGS. 8A and 8B, the second portion 62 of the internal frame 6 is connected to the upper surface of the second base 5B by an appropriate method such as adhesion. The second portion 62 is positioned in a space surrounded by the display module 2, the cover member 3, the external frame 4, and the housing 5 (second base 5B), and faces the second side surface 22 of the display module 2. The second portion 62 may further face the side surface of the cover member 3. Gaps are formed between the second portion 62 and the second side surface 22, between the second portion 62 and the base end portion 41, and between the second portion 62 and the edge portion 42, respectively. Incidentally, the gap may not be formed between the second portion 62 and the edge portion 42. In that case, the second portion 62 and the edge portion 42 are in contact with each other, but are not bonded.

As illustrated in FIG. 8B, a first distance d1 and a second distance d2 are defined. The first distance d1 corresponds to a distance between the first end portion 41a and the second portion 62 in a direction (Y direction) from the second side surface 22 toward the base end portion 41. The second distance d2 corresponds to a distance between the second end portion 41b and the second portion 62 in the direction. In a case where the display device 1 has the flat shape F0, the first distance d1 and the second distance d2 are the same. Also in the cross section of the display device 1 including the first portion 61, in a case where the display device 1 has the flat shape F0, a first distance between the first end portion 41a and the first portion 61 and a second distance between the second end portion 41b and the first portion 61 are the same.

Figure 8C:
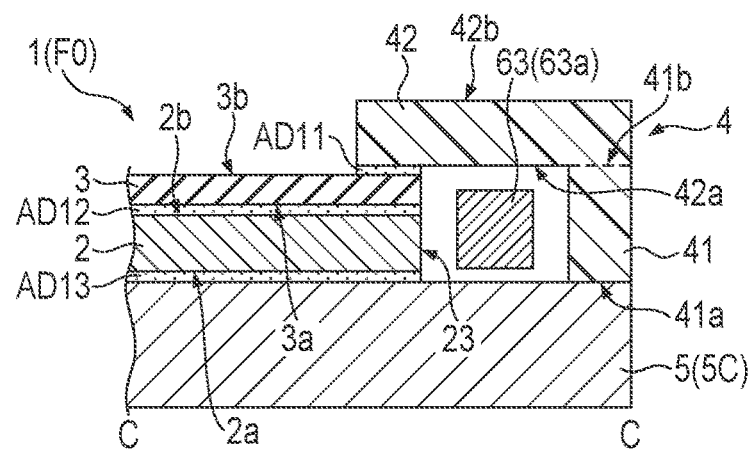
FIG. 8C is a schematic cross-sectional view of the display device in the flat shape illustrated in FIG. 7 as viewed along line C-C.

As illustrated in FIG. 8C, similarly to the second portion 62, the third portion 63 of the internal frame 6 is positioned in a space surrounded by the display module 2, the cover member 3, the external frame 4, and the housing 5. The third portion 63 faces the third side surface 23 of the display module 2. The third portion 63 may further face the side surface of the cover member 3. Gaps are formed between the third portion 63 and the third side surface 23, between the third portion 63 and the base end portion 41, and between the third portion 63 and the edge portion 42, respectively. Incidentally, in the example of FIG. 8C, the third portion 63 (central area 63a) is not connected to the housing 5 (hinge 5C), and there is a gap therebetween.

Figure 9A:
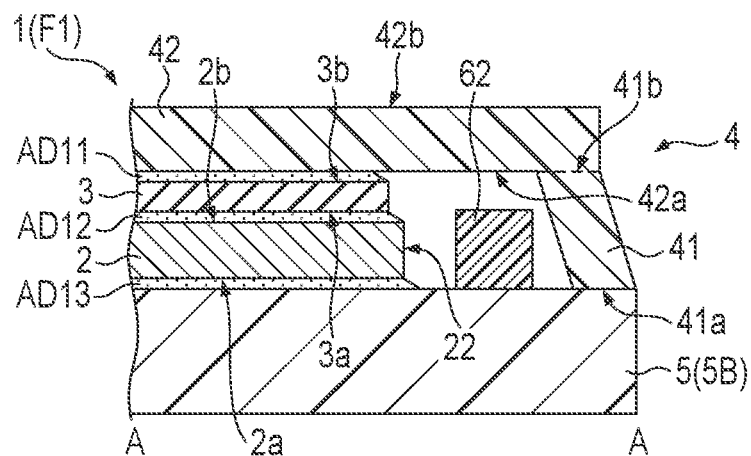
FIG. 9A is a schematic cross-sectional view of the display device in an open shape illustrated in FIG. 7 as viewed along line A-A.
Figure 9B:
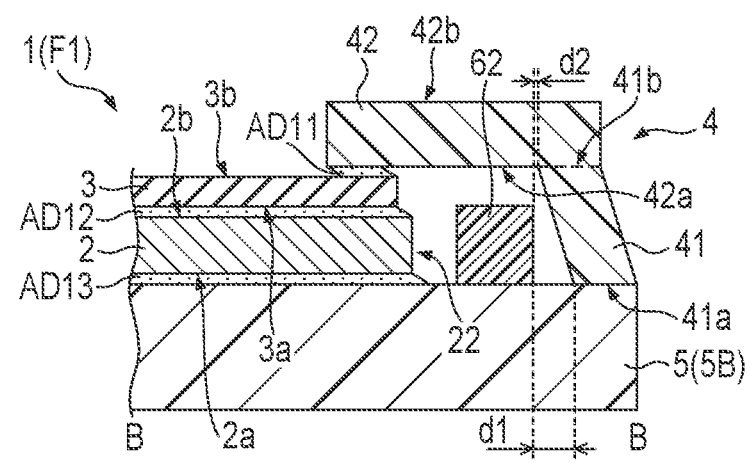
FIG. 9B is a schematic cross-sectional view of the display device in the open shape illustrated in FIG. 7 as viewed along line B-B.
Figure 9C:
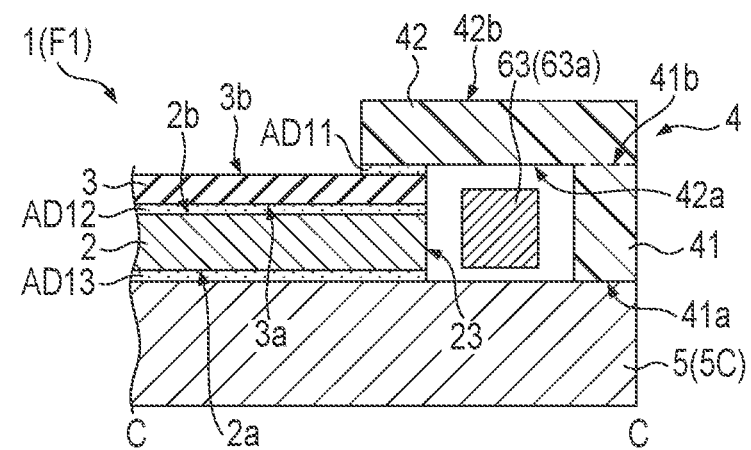
FIG. 9C is a schematic cross-sectional view of the display device in the open shape illustrated in FIG. 7 as viewed along line C-C.

FIGS. 9A, 9B, and 9C are schematic cross-sectional views of the display device 1 deformed into the open shape F1 illustrated in FIG. 7 as viewed along lines A-A, B-B, and C-C, respectively. In the open shape F1, as illustrated in FIGS. 9A and 9B, the laminate including the display module 2 and the cover member 3 is deformed such that the lower surface side protrudes toward the base end portion 41 more than the upper surface side. In a case where the neutral plane separation described with reference to FIG. 4 is applied, the deviation between the upper surface side and the lower surface side of the laminate becomes more remarkable.

In this embodiment, the external frame 4 is bonded to the cover member 3 via the first adhesive layer AD11. Further, since the external frame 4 is flexible, the external frame 4 is deformed together with the display module 2 and the cover member 3.

In the open shape F1, the edge portion 42 of the external frame 4 is pulled by the upper surface 3b of the cover member 3 in the vicinity of the second side surface 22 illustrated in FIGS. 9A and 9B. Therefore, the base end portion 41 is inclined such that the second end portion 41b is positioned closer to the display module 2 side than the first end portion 41a. On the other hand, as illustrated in FIG. 9C, the cross-sectional shape of the display device 1 including the third side surface 23 does not particularly change from the case of the flat shape F0 (FIG. 8C) even in the open shape F1.

As illustrated in FIG. 9B, in a case where the display device 1 has the open shape F1, the second distance d2 is smaller than the first distance d1. Also in the cross section of the display device 1 including the first portion 61, in a case where the display device 1 has the open shape F1, a second distance between the second end portion 41b and the first portion 61 is smaller than the first distance between the first end portion 41a and the first portion 61.

Figure 10A:
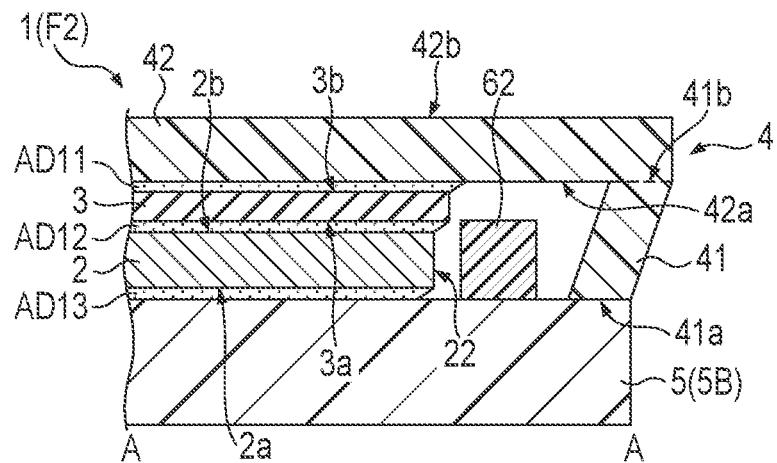
FIG. 10A is a schematic cross-sectional view of the display device in a closed shape illustrated in FIG. 7 as viewed along line A-A.
Figure 10B:
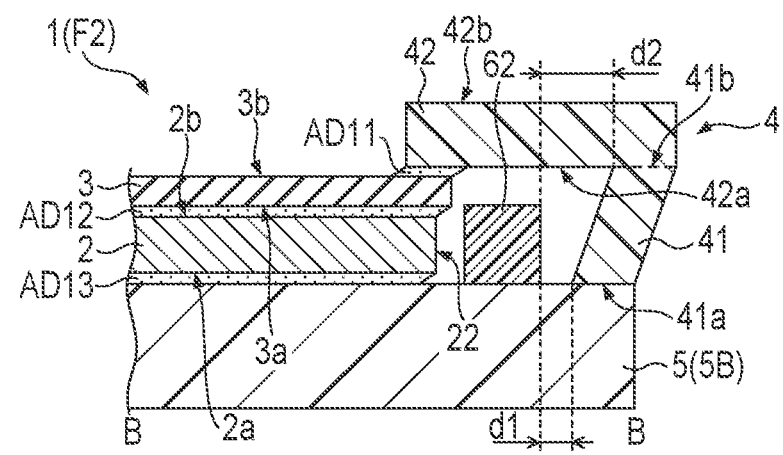
FIG. 10B is a schematic cross-sectional view of the display device in the closed shape illustrated in FIG. 7 as viewed along line B-B.
Figure 10C:
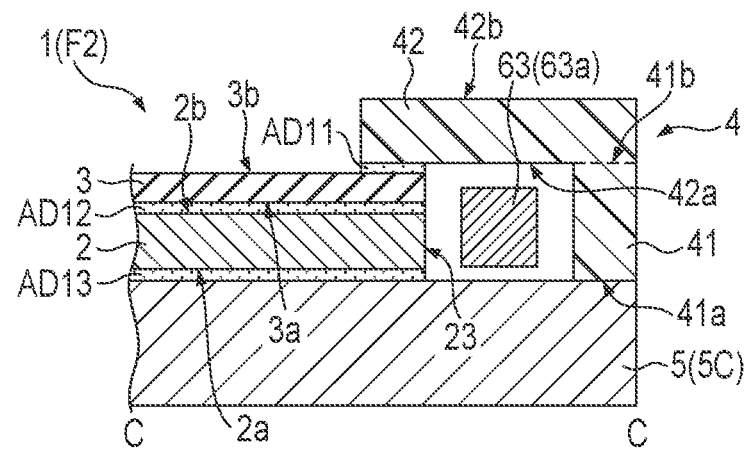
FIG. 10C is a schematic cross-sectional view of the display device in the closed shape illustrated in FIG. 7 as viewed along line C-C.

FIGS. 10A, 10B, and 10C are schematic cross-sectional views of display device 1 deformed into the closed shape F2 illustrated in FIG. 7 as viewed along lines A-A, B-B, and C-C, respectively. In the closed shape F2, as illustrated in FIGS. 10A and 10B, the laminate including the display module 2 and the cover member 3 is deformed such that the upper surface side protrudes toward the base end portion 41 more than the lower surface side. In a case where the neutral plane separation described with reference to FIG. 4 is applied, the deviation between the upper surface side and the lower surface side of the laminate becomes more remarkable.

In the closed shape F2, the edge portion 42 of the external frame 4 is pushed by the upper surface 3b of the cover member 3 in the vicinity of the second side surface 22 illustrated in FIGS. 10A and 10B. Therefore, the base end portion 41 is inclined such that the first end portion 41a is positioned closer to the display module 2 side than the second end portion 41b. On the other hand, as illustrated in FIG. 10C, the cross-sectional shape of the display device 1 including the third side surface 23 does not particularly change from the case of the flat shape F0 (FIG. 8C) even in the closed shape F2.

As illustrated in FIG. 10B, in a case where the display device 1 has the closed shape F2, the second distance d2 is larger than the first distance d1. Also in the cross section of the display device 1 including the first portion 61, in a case where the display device 1 has the closed shape F2, the second distance between the second end portion 41b and the first portion 61 is larger than the first distance between the first end portion 41a and the first portion 61.

Incidentally, in each of the flat shape F0, the open shape F1, and the closed shape F2, the cross-sectional structure of the display device 1 including the first side surface 21 and the first portion 61 is similar to the cross-sectional structure illustrated in FIGS. 8A, 8B, 9A, 9B, 10A, and 10B. Further, in each of the flat shape F0, the open shape F1, and the closed shape F2, the cross-sectional structure of the display device 1 including the fourth side surface 24 and the fourth portion 64 is similar to the cross-sectional structure illustrated in FIG. 8C.

According to this embodiment described above, it is possible to obtain the display device 1 in which both bending resistance, and dustproofness and waterproofness are achieved. That is, unlike the comparative example illustrated in FIG. 5 in the case of using the rigid frame 204, the external frame 4 is flexible, and thus the deformation of the laminate is hardly hindered even when the laminate including the display module 2 and the cover member 3 is bonded to the edge portion 42. Accordingly, the gap G illustrated in FIG. 5 can be eliminated, and the dustproofness and waterproofness of the display device 1 are enhanced. Further, when the external frame 4 is flexible, the display device 1 can be smoothly deformed between the flat shape F0, the open shape F1, and the closed shape F2.

On the other hand, in a case where the external frame 4 is flexible, the peripheral edge portion of the display module 2 may not be sufficiently protected. In this regard, in this embodiment, the internal frame 6 having higher rigidity than the external frame 4 is arranged between the base end portion 41 of the external frame 4 and the side surfaces 21 to 24 of the display module 2. With this structure, the display device 1 can be protected from an external force such as an impact.

In addition, various effects described above can be obtained from this embodiment.

Second Embodiment

A second embodiment will be described. The same configuration as that of the first embodiment can be applied to a configuration not particularly mentioned.

Figure 11:
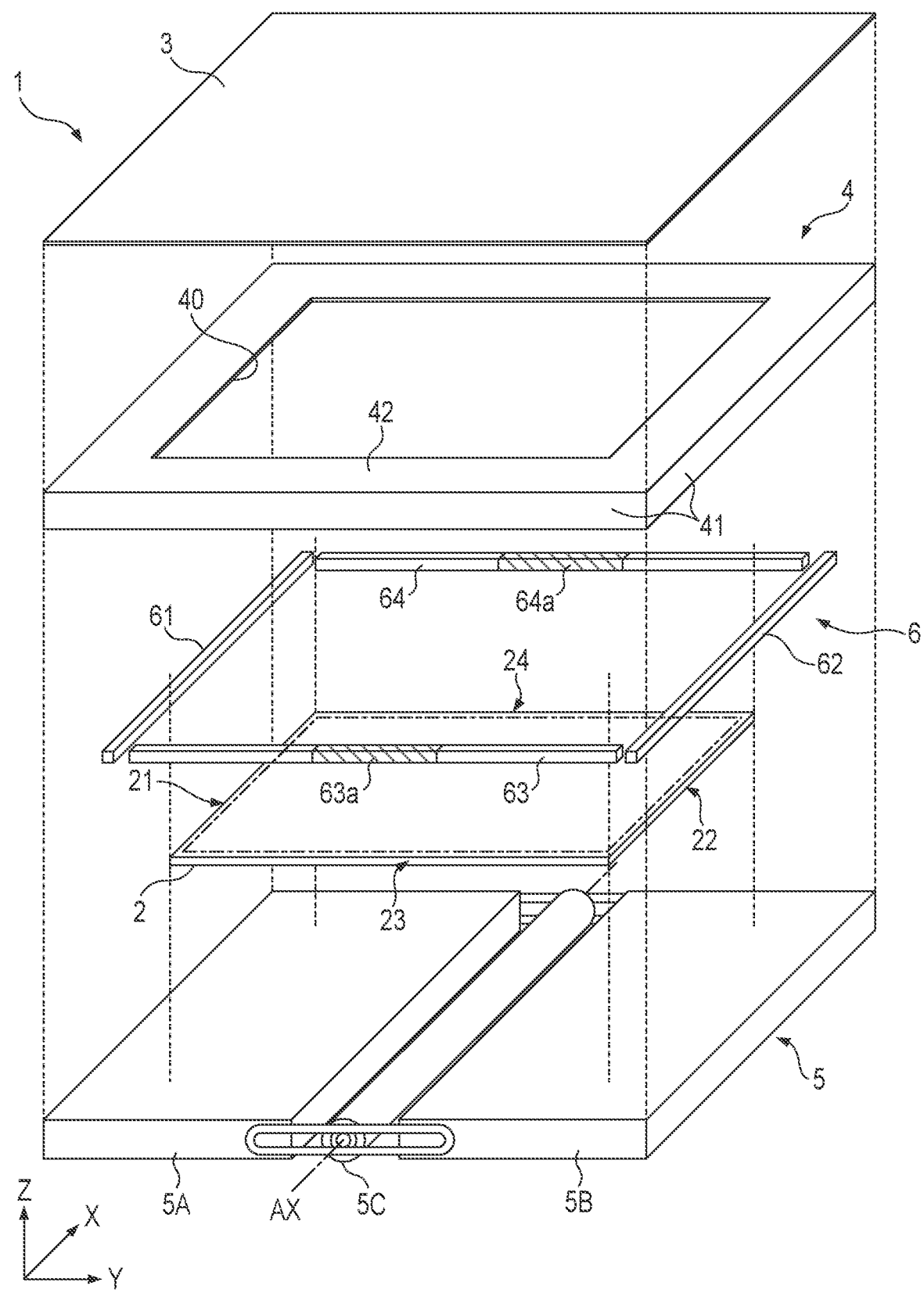
FIG. 11 is a schematic exploded perspective view of a display device according to a second embodiment.
Figure 12:
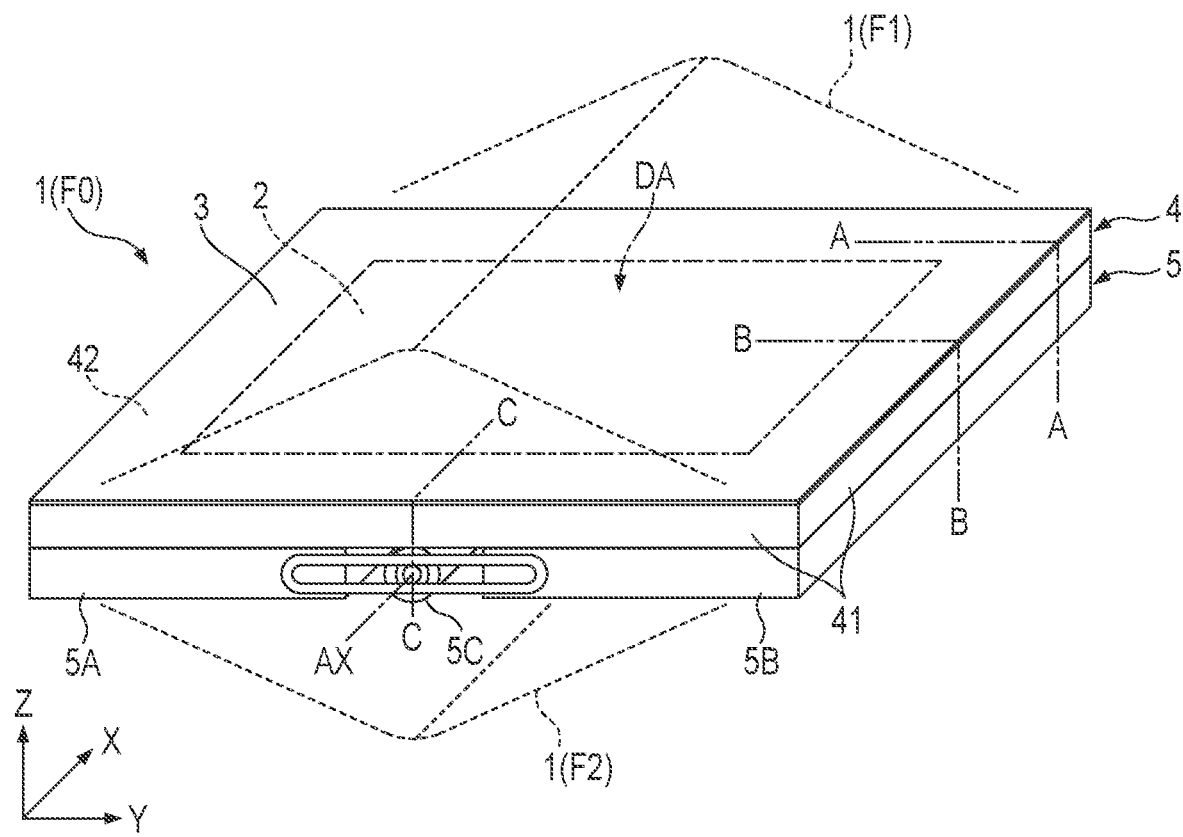
FIG. 12 is a schematic perspective view of the display device according to the second embodiment in an assembled state.

FIG. 11 is a schematic exploded perspective view of a display device 1 according to this embodiment. FIG. 12 is a schematic perspective view of the display device 1 in an assembled state. Similarly to the first embodiment, the display device 1 includes a display module 2, a cover member 3, an external frame 4, a housing 5, and an internal frame 6.

As illustrated in FIG. 11, in the display device 1 according to this embodiment, the edge portion 42 of the external frame 4 is positioned between the housing 5 and the cover member 3. In a state where the display device 1 is assembled as illustrated in FIG. 12, the cover member 3 entirely covers the display module 2 and the edge portion 42. Similarly to the first embodiment, the display device 1 can be deformed into a flat shape F0, an open shape F1, and a closed shape F2.

Figure 13A:
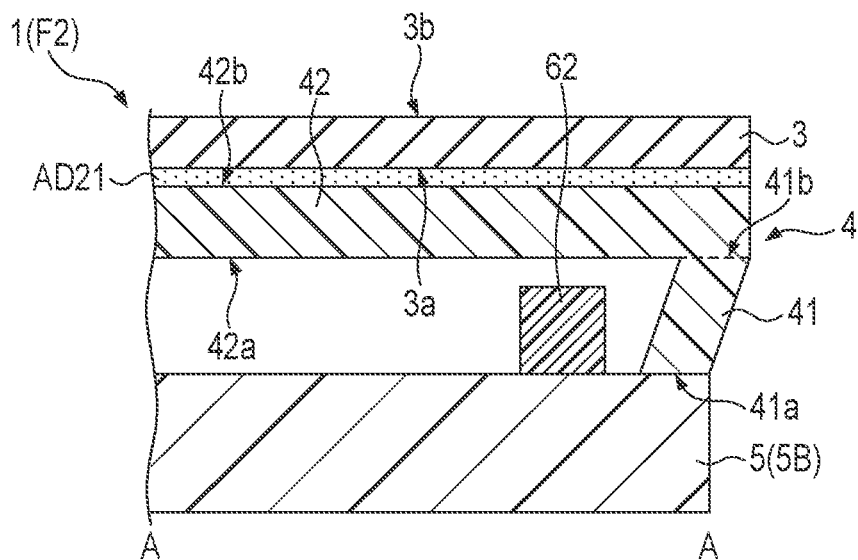
FIG. 13A is a schematic cross-sectional view of the display device in a closed shape illustrated in FIG. 12 as viewed along line A-A.
Figure 13B:
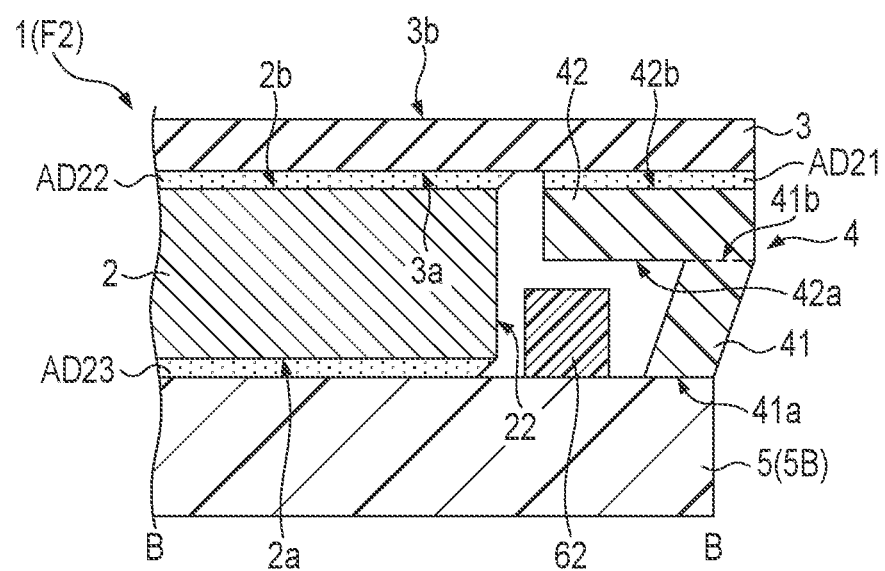
FIG. 13B is a schematic cross-sectional view of the display device in the closed shape illustrated in FIG. 12 as viewed along line B-B.
Figure 13C:
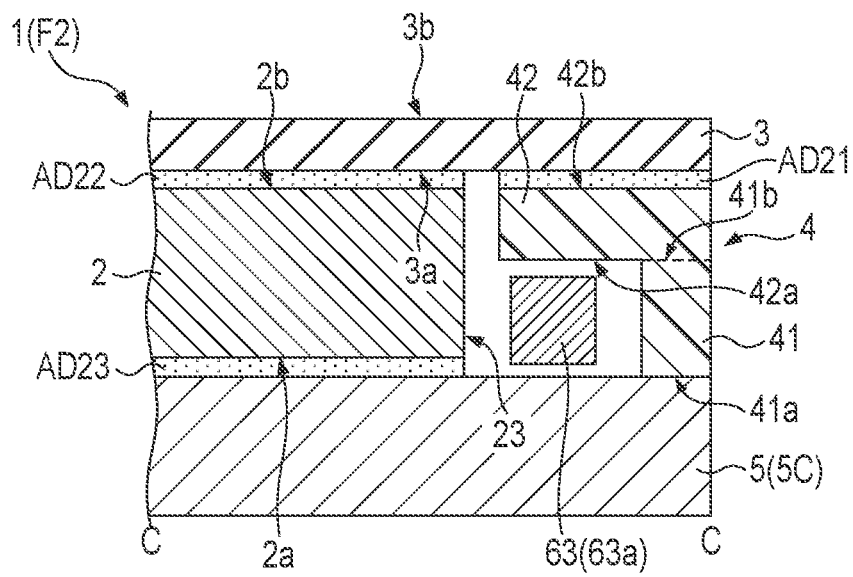
FIG. 13C is a schematic cross-sectional view of the display device in the closed shape illustrated in FIG. 12 as viewed along line C-C.

FIGS. 13A, 13B, and 13C are schematic cross-sectional views of the display device 1 having the closed shape F2 illustrated in FIG. 12 as viewed along lines A-A, B-B, and C-C, respectively. As illustrated in these drawings, a lower surface 3a of the cover member 3 and an upper surface 42b of the edge portion 42 are bonded by a first adhesive layer AD21.

As illustrated in FIG. 13A, the display module 2 does not exist below the edge portion 42. As illustrated in FIG. 13B, the tip of the edge portion 42 faces the second side surface 22 of the display module 2. Further, as illustrated in FIG. 13C, the tip of the edge portion 42 also faces the third side surface 23 of the display module 2.

The upper surface 2b of the display module 2 is bonded to the lower surface 3a of the cover member 3 by a second adhesive layer AD22. The lower surface 2a of the display module 2 is bonded to the housing 5 by a third adhesive layer AD23.

The Young's moduli of the adhesive layers AD21 to AD23 are preferably smaller than the Young's moduli of the display module 2 and the cover member 3. Accordingly, the deformation of the display module 2 and the cover member 3 is less likely to be hindered by the adhesive layers AD21 to AD23.

As illustrated in FIG. 13B, a second portion 62 of the internal frame 6 is positioned in a space surrounded by the display module 2, the cover member 3, the external frame 4, and the housing 5, and faces the second side surface 22 of the display module 2. Further, as illustrated in FIG. 13C, a third portion 63 of the internal frame 6 is positioned in a space surrounded by the display module 2, the cover member 3, the external frame 4, and the housing 5, and faces the third side surface 23 of the display module 2.

The cross-sectional structure of the display device 1 including a first side surface 21 and a first portion 61 is similar to the cross-sectional structure illustrated in FIGS. 13A and 13B. Further, the cross-sectional structure of the display device 1 including a fourth side surface 24 and a fourth portion 64 is similar to the cross-sectional structure illustrated in FIG. 13C.

Even in the structure of the display device 1 according to this embodiment, the display device 1 in which both bending resistance, and dustproofness and waterproofness are achieved can be obtained similarly to the first embodiment. Further, in this embodiment, the entire outermost surface of the display device 1 is covered with the cover member 3, and thus a smooth display surface without unevenness can be realized.

Figure 14:
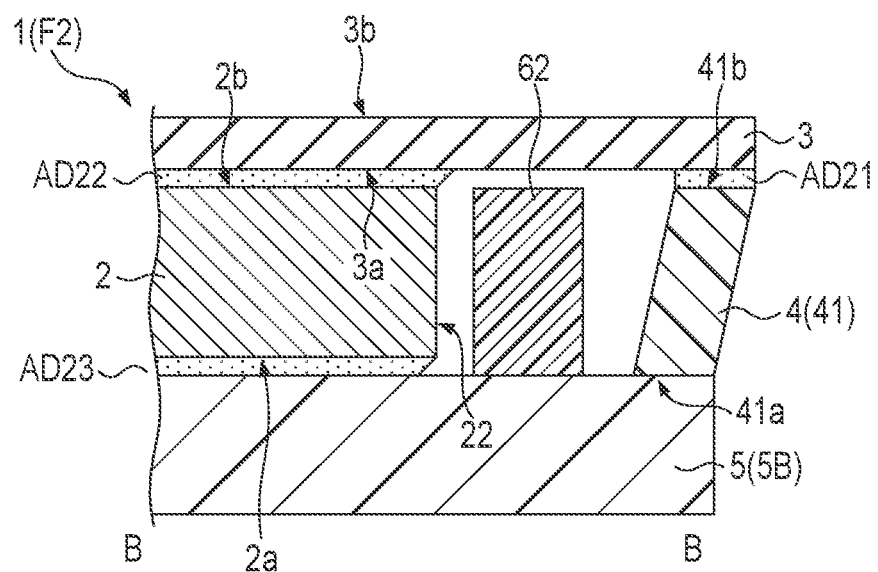
FIG. 14 is a schematic cross-sectional view of a display device according to a modification.

FIG. 14 is a schematic cross-sectional view of a display device 1 according to a modification of this embodiment. Similarly to FIG. 13B, this cross-sectional view includes the second side surface 22 of the display module 2 and the second portion 62 of the internal frame 6. In this modification, the external frame 4 does not have the edge portion 42. Further, the second portion 62 is formed to be higher than the example of FIG. 13B and faces the entire second side surface 22. Also in the vicinity of the first portion 61, the third portion 63, and the fourth portion 64 of the internal frame 6, a shape without the edge portion 42 can be applied similarly to FIG. 14.

Third Embodiment

A third embodiment will be described. The same configurations as those of the above-described embodiments can be applied to a configuration not particularly mentioned.

FIG. 15 is a schematic exploded perspective view of a display device 1 according to this embodiment. Similarly to the first embodiment, the display device 1 includes a display module 2, a cover member 3, an external frame 4, a housing 5, and an internal frame 6.

The display device 1 according to this embodiment further includes a first plate 7A and a second plate 7B. These plates 7A and 7B are arranged between the display module 2 and the housing 5.

In the Z direction, the first plate 7A overlaps with an area of the display module 2 closer to a first side surface 21 than the center in the Y direction. Further, the first plate 7A overlaps with an area of a first base 5A and a hinge 5C closer to the first base 5A than a bending axis AX in the Z direction. For example, the first plate 7A is bonded to both the display module 2 and the first base 5A.

In the Z direction, the second plate 7B overlaps with an area of the display module 2 closer to a second side surface 22 than the center in the Y direction. Further, the second plate 7B overlaps with an area of a second base 5B and a hinge 5C closer to the second base 5B than the bending axis AX in the Z direction. For example, the second plate 7B is bonded to both the display module 2 and the second base 5B.

When the plates 7A and 7B are arranged as in this embodiment, the display module 2 can be more favorably protected. Further, since the hinge 5C is covered with the plates 7A and 7B, unevenness on the lower surface side of the display module 2 is reduced.

Fourth Embodiment

A fourth embodiment will be described. The same configurations as those of the above-described embodiments can be applied to a configuration not particularly mentioned.

Figure 16:
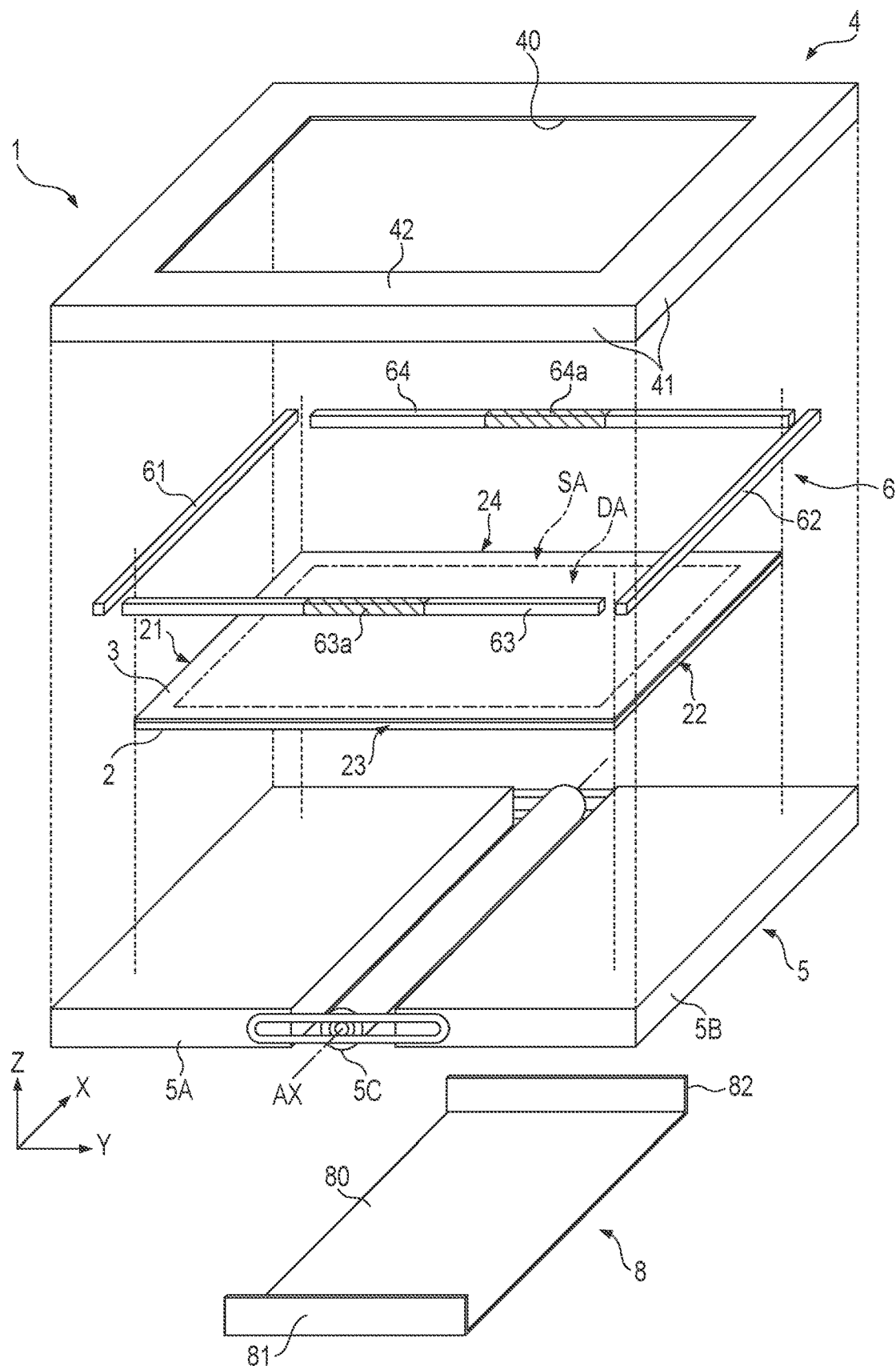
FIG. 16 is a schematic exploded perspective view of a display device according to a fourth embodiment.
Figure 17:
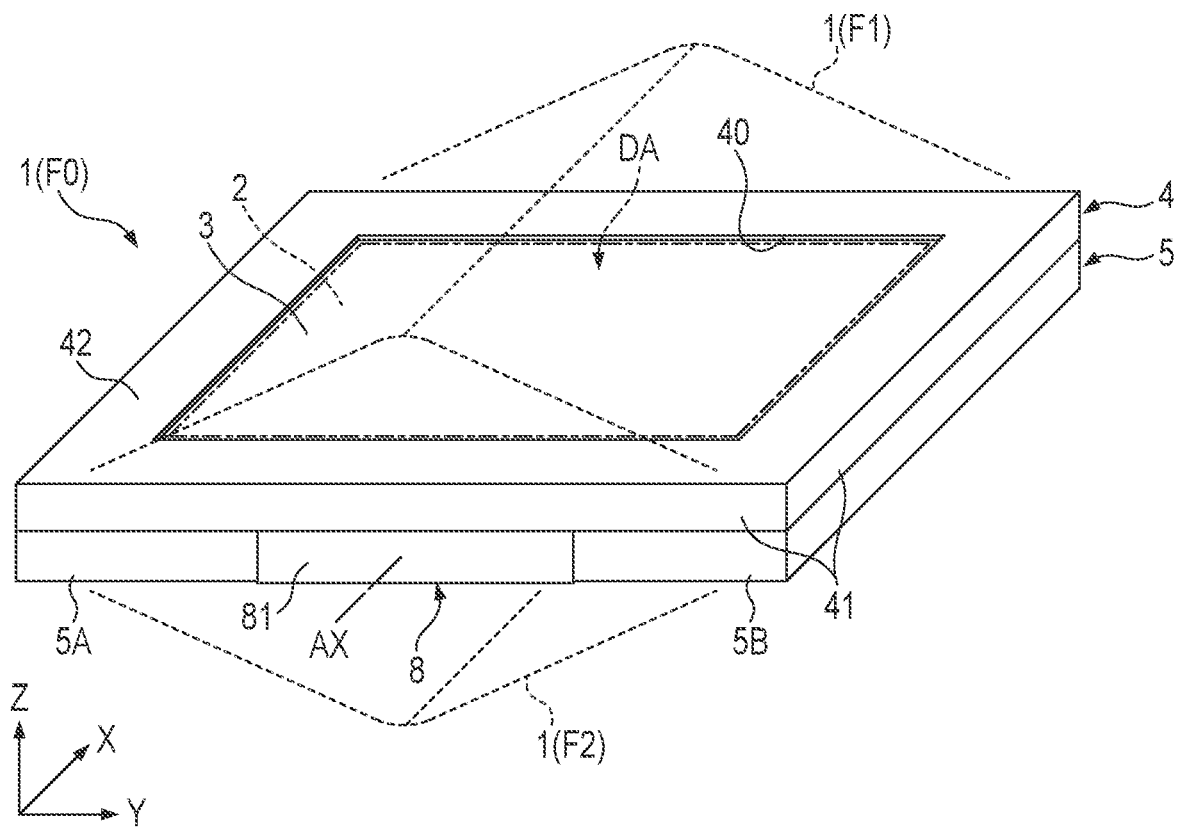
FIG. 17 is a schematic perspective view of the display device according to the fourth embodiment in an assembled state.

FIG. 16 is a schematic exploded perspective view of a display device 1 according to this embodiment. FIG. 17 is a schematic perspective view of the display device 1 in an assembled state. Similarly to the first embodiment, the display device 1 includes a display module 2, a cover member 3, an external frame 4, a housing 5, and an internal frame 6.

The display device 1 according to this embodiment includes a cover 8 arranged on the lower surface side of the housing 5. The cover 8 includes a lower surface portion 80 and a pair of side surface portions 81 and 82 protruding in the Z direction from both respective ends of the lower surface portion 80 in the X direction.

The lower surface portion 80 faces a part of the lower surfaces of bases 5A and 5B and the entire lower surface of a hinge 5C. The side surface portions 81 and 82 face a part of the side surfaces of the bases 5A and 5B in the X direction and the entire side surface of the hinge 5C in the X direction.

The cover 8 is preferably formed of a flexible material having excellent waterproofness. As an example, the cover 8 may be formed of the same material as that of the external frame 4.

In a state where the display device 1 is assembled as illustrated in FIG. 17, the hinge 5C is entirely covered with the cover 8. The cover 8 is bonded to the bases 5A and 5B without a gap, for example. The tip portions of the side surface portions 81 and 82 may or may not overlap with the external frame 4. In a case where the tip portions of the side surface portions 81 and 82 and the external frame 4 overlap with each other, these tip portions may be bonded to the outer surface of the external frame 4 or may be inserted inside the external frame 4.

According to the configuration of this embodiment, the hinge 5C is covered with the cover 8, and thus the dustproofness and waterproofness of the display device 1 can be further improved.

Fifth Embodiment

A fifth embodiment will be described. The same configurations as those of the above-described embodiments can be applied to a configuration not particularly mentioned.

In a general display device, a glass cover member is arranged on the outermost surface, and thus water vapor hardly enters a display device 1 through the cover member. Further, when the glass cover member is arranged, the outermost surface is hardly scratched. On the other hand, in the foldable display device 1 as exemplified in each of the above-described embodiments, a glass cover member cannot be arranged. Therefore, it is necessary to prevent water vapor infiltration to the inside of the display device 1 from the outermost surface, and preferably to take measures for suppressing scratching of the outermost surface.

In this embodiment, some structure examples of the display device 1 in which a barrier layer (barrier film) for suppressing the water vapor infiltration is arranged above the display module 2, and a hard coat layer (hard coat film) is preferably arranged as the outermost layer of a laminate including the display module 2 are described.

Figure 18:
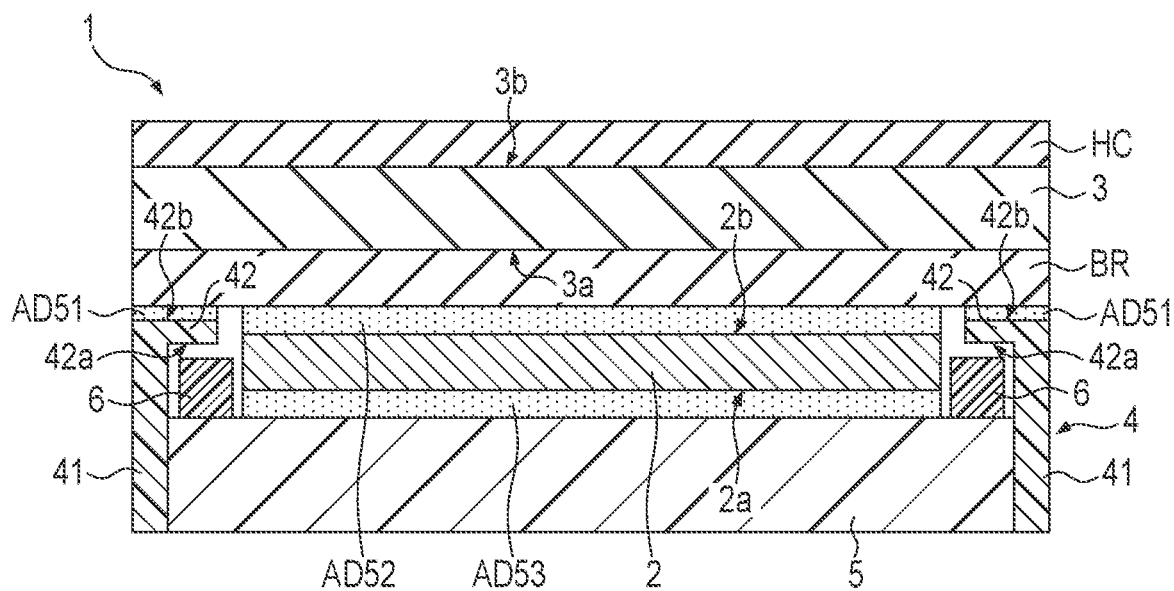
FIG. 18 is a schematic cross-sectional view of a display device according to a first structure example.

FIG. 18 is a schematic cross-sectional view of the display device 1 according to a first structure example. The display device 1 includes a display module 2, a cover member 3, an external frame 4, a housing 5, and an internal frame 6 similarly to the above-described embodiments. Further, the display device 1 further includes a barrier layer BR and a hard coat layer HC.

The display module 2, the barrier layer BR, the cover member 3, and the hard coat layer HC are laminated in this order above the housing 5. That is, the barrier layer BR is positioned between the display module 2 and the cover member 3 on an upper surface $2b$ side of the display module 2. In the example of FIG. 18, a base end portion 41 of the external frame 4 is connected to the side surface of the housing 5, but the base end portion 41 may be connected to the upper surface of the housing 5 similarly to the above-described embodiments.

As an example, the display module 2 includes a display panel including a display element and a polarizing film arranged above the display panel. The display module 2 may further include a cover film arranged above the polarizing film, a support film arranged below the display panel, a touch panel arranged between the polarizing film and the display panel, and the like. Adjacent elements among the display panel, the polarizing film, the cover film, the support film, and the touch panel may be bonded to each other via an adhesive layer.

The barrier layer BR is formed of an inorganic material such as SiN or SiO, for example, and is arranged on the upper surface 2b side of the display module 2. The hard coat layer HC is formed of, for example, an acrylic resin or the like, and is positioned at the outermost layer of the laminate including the display module 2. For example, the barrier layer BR is formed on a lower surface 3a of the cover member 3, and the hard coat layer HC is formed on an upper surface 3b of the cover member 3.

The barrier layer BR has moisture permeability lower than that of the cover member 3, for example, and suppresses the water vapor infiltration to the display module 2 side. The hard coat layer HC has higher hardness than the cover member 3, for example, and suppresses scratches on the display surface of the display device 1.

In the example of FIG. 18, an upper surface 42b of an edge portion 42 and the barrier layer BR are bonded by a first adhesive layer AD51. Further, the upper surface 2b of the display module 2 and the barrier layer BR are bonded by a second adhesive layer AD52, and a lower surface 2a of the display module 2 and the housing 5 are bonded by a third adhesive layer AD53.

Since the barrier layer BR is formed of an inorganic material, for example, when the barrier layer BR is formed at a position away from the neutral plane as in the vicinity of the outermost surface of the display device 1, the barrier layer BR is more likely to be damaged by a bending operation than other members. In this regard, in the example of FIG. 18, a relatively thick cover member 3 is arranged above the barrier layer BR. Accordingly, the barrier layer BR can be brought close to the neutral plane, and the damage of the barrier layer BR is suppressed.

Figure 19:
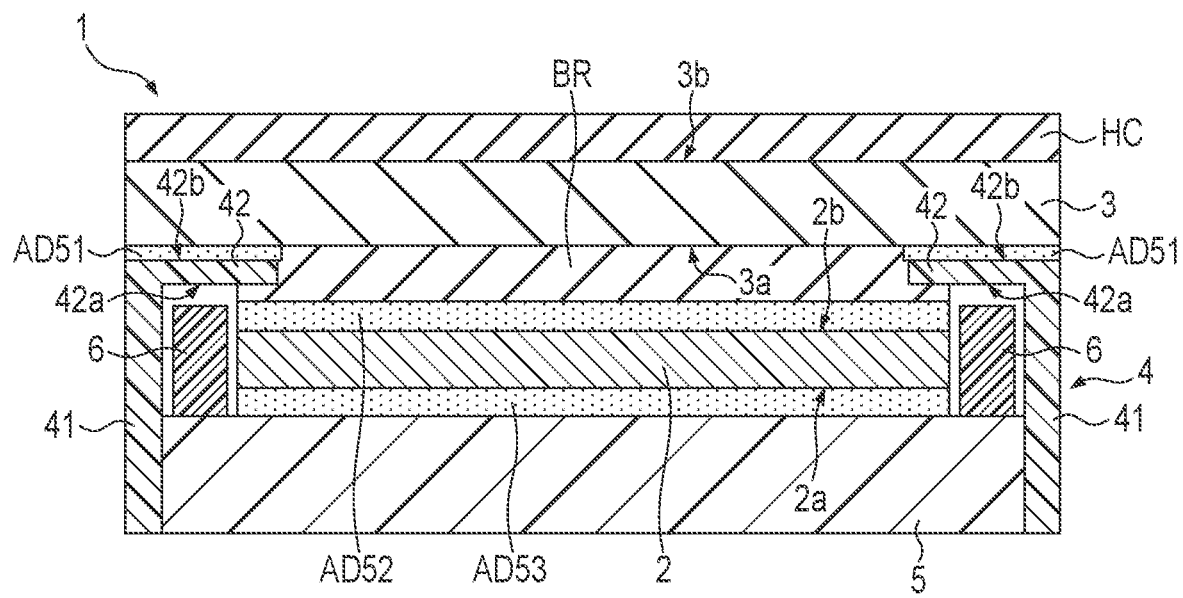
FIG. 19 is a schematic cross-sectional view of a display device according to a second structure example.

FIG. 19 is a schematic cross-sectional view of the display device 1 according to a second structure example. Similarly to the example of FIG. 18, the display module 2, the barrier layer BR, the cover member 3, and the hard coat layer HC are laminated in this order above the housing 5. In the example of FIG. 19, the lower surface 3a of the cover member 3 and the upper surface 42b of the edge portion 42 are bonded by the first adhesive layer AD51. Further, a part of the barrier layer BR is positioned between a lower surface 42a of the edge portion 42 and the display module 2.

Figure 20:
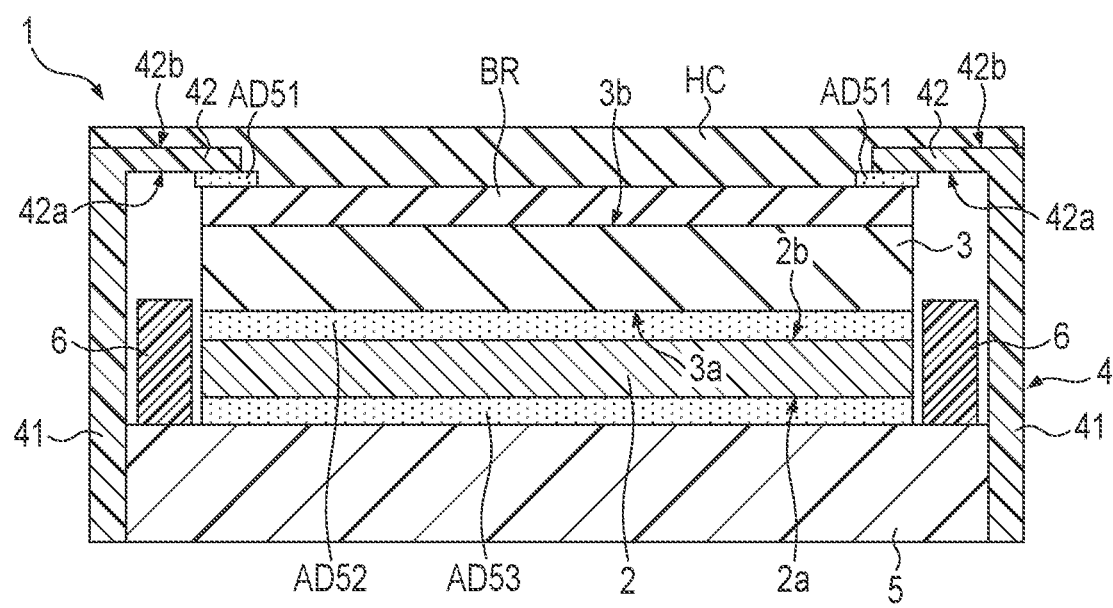
FIG. 20 is a schematic cross-sectional view of a display device according to a third structure example.

FIG. 20 is a schematic cross-sectional view of the display device 1 according to a third structure example. In the illustrated example, the display module 2, the cover member 3, the barrier layer BR, and the hard coat layer HC are laminated in this order above the housing 5. That is, the barrier layer BR is positioned on the upper surface 3b side of the cover member 3. Further, the barrier layer BR and the lower surface 42a of the edge portion 42 are bonded by the first adhesive layer AD51, and the lower surface 3a of the cover member 3 and the upper surface 2b of the display module 2 are bonded by the second adhesive layer AD52. The hard coat layer HC covers the upper surface 42b of the edge portion 42 and covers the barrier layer BR through the opening inside the edge portion 42.

Figure 21:
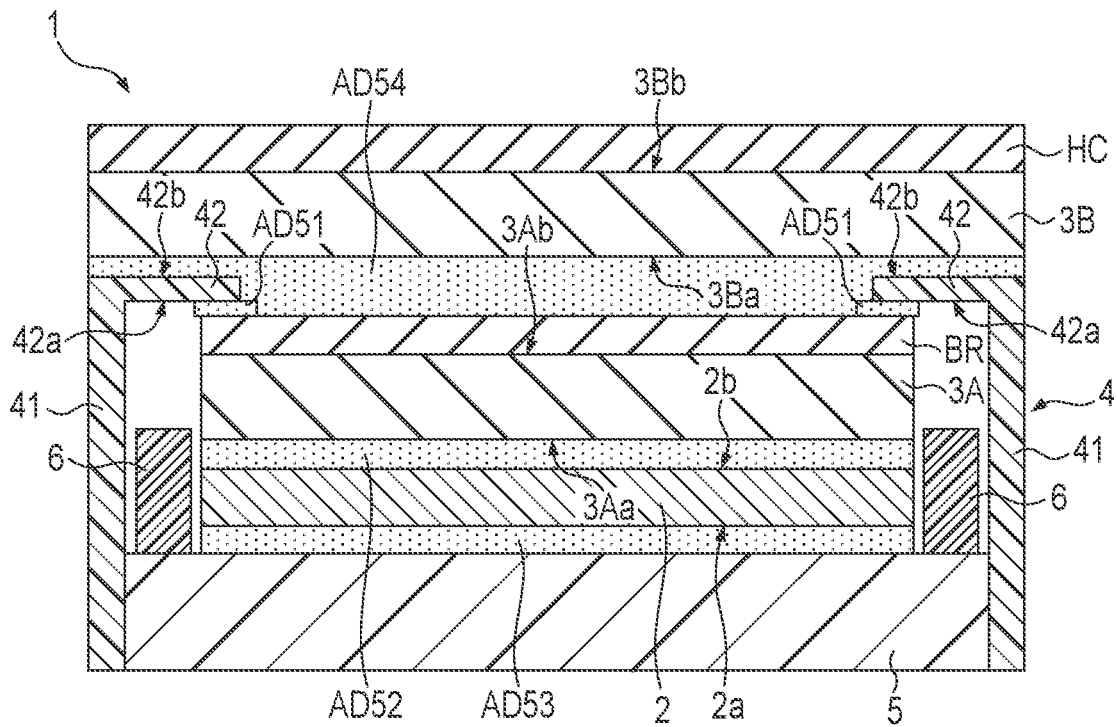
FIG. 21 is a schematic cross-sectional view of a display device according to a fourth structure example.

FIG. 21 is a schematic cross-sectional view of the display device 1 according to a fourth structure example. The display device 1 includes a first cover member 3A and a second cover member 3B instead of the cover member 3. The display module 2, the first cover member 3A, the barrier layer BR, the second cover member 3B, and the hard coat layer HC are laminated in this order above the housing 5.

The barrier layer BR and the lower surface 42a of the edge portion 42 are bonded by the first adhesive layer AD51, and a lower surface 3Aa of the first cover member 3A and the upper surface 2b of the display module 2 are bonded by the second adhesive layer AD52. The hard coat layer HC is formed on an upper surface 3Bb of the second cover member 3B.

A fourth adhesive layer AD54 is formed between the second cover member 3B, the barrier layer BR, and the edge portion 42. The fourth adhesive layer AD54 is formed using, for example, a UV curable resin. Incidentally, the fourth adhesive layer AD54 may have a film shape in which adhesive layers are formed on both surfaces of a base material.

In a case where the first cover member 3A is arranged below the barrier layer BR as in the example of FIG. 21, the barrier layer BR can be brought close to the neutral plane by arranging the second cover member 3B above the barrier layer BR. Accordingly, the damage of the barrier layer BR can be suppressed.

Figure 22:
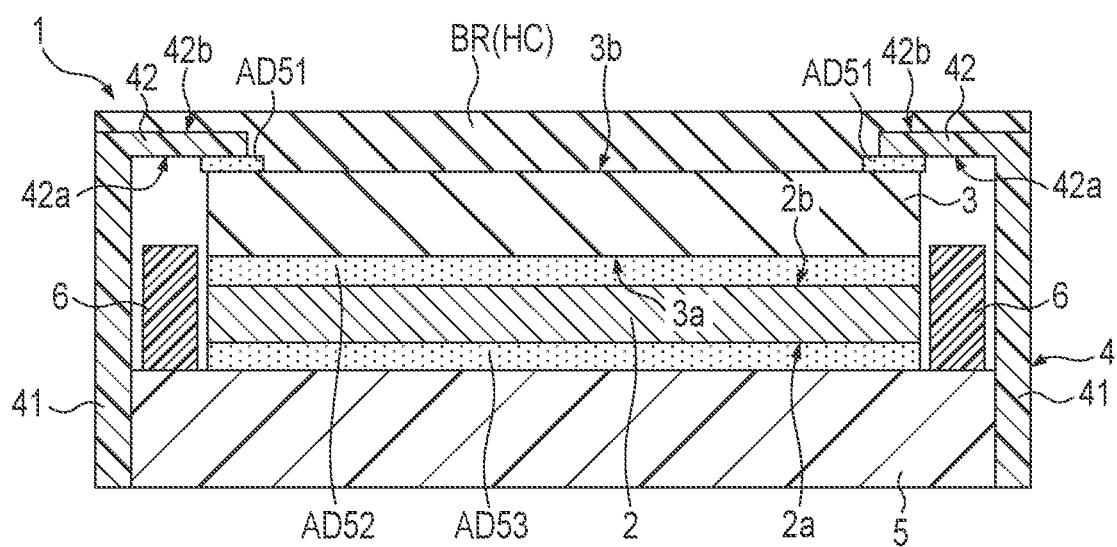
FIG. 22 is a schematic cross-sectional view of a display device according to a fifth structure example.

FIG. 22 is a schematic cross-sectional view of the display device 1 according to a fifth structure example. Similarly to the examples of FIGS. 20 and 21, in the display device 1, the display module 2, the cover member 3, and the barrier layer BR are laminated in this order above the housing 5. Further, the cover member 3 and the lower surface 42a of the edge portion 42 are bonded by the first adhesive layer AD51, and the lower surface 3a of the cover member 3 and the upper surface 2b of the display module 2 are bonded by the second adhesive layer AD52. The barrier layer BR covers the upper surface 42b of the edge portion 42 and covers the upper surface 3b of the cover member 3 through the opening inside the edge portion 42.

Figure 23:
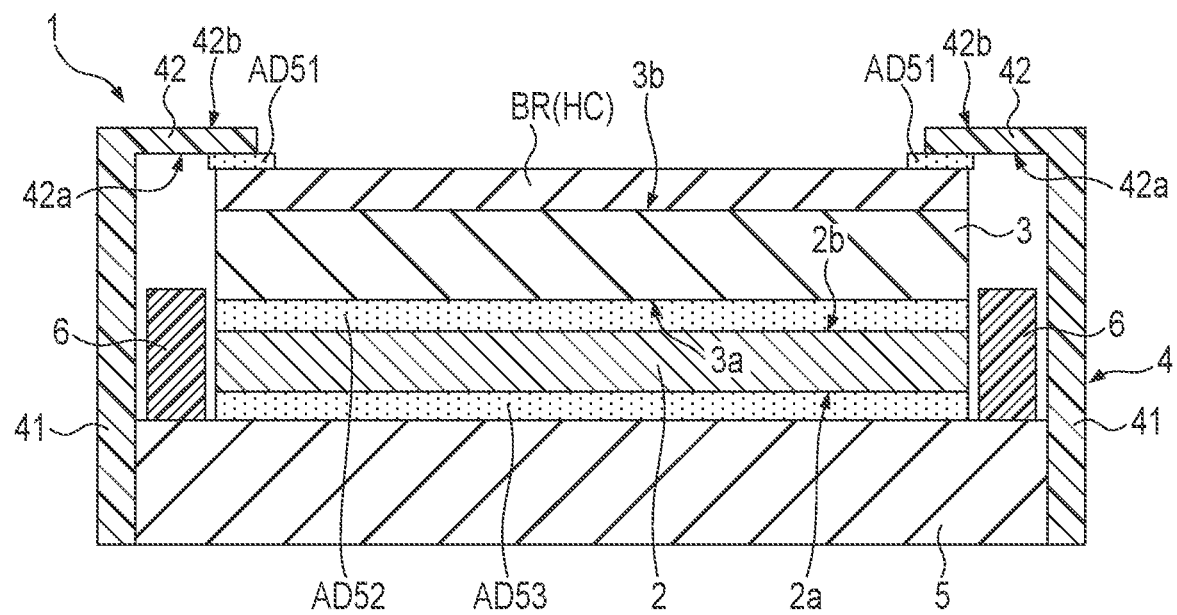
FIG. 23 is a schematic cross-sectional view of a display device according to a sixth structure example.

FIG. 23 is a schematic cross-sectional view of the display device 1 according to a sixth structure example. The display device 1 is different from the example of FIG. 22 in that the lower surface 42a of the edge portion 42 is bonded to the barrier layer BR by the first adhesive layer AD51.

The display device 1 illustrated in FIGS. 22 and 23 does not include the hard coat layer HC. For example, the barrier layer BR may also serve as a hard coat layer. Further, a hard coat layer may be formed above the barrier layer BR.

The first to sixth structure examples described above can be appropriately combined with the display device 1 according to the first to fourth embodiments. Further, the present invention is not limited to the first to sixth structure examples, and various structures can be applied to the display device 1 including the barrier layer and the hard coat layer.

In each embodiment, an example has been described in which the edge portion 42 of the external frame 4 and the upper surface 2b of the display module 2 are indirectly connected via another member such as the cover member 3. However, the edge portion 42 and the upper surface 2b may be directly connected (bonded) via an adhesive layer.

All of the display devices that can be implemented by a person of ordinary skill in the art through arbitrary design changes to the display devices described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, additions, deletions or changes in design of the constituent elements or additions, omissions, or changes in condition of the processes arbitrarily conducted by a person of ordinary skill in the art, in the above embodiments, fall within the scope of the present invention as long as they are in keeping with the spirit of the present invention.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. A display device comprising:
    a housing;
    a flexible display module which includes a first surface facing the housing, a second surface opposite to the first surface, and a side surface connecting the first surface and the second surface;
    an external frame which includes a base end portion connected to the housing and an edge portion formed integrally with the base end portion and facing the second surface, and covers the display module; and
    an internal frame which is arranged between the base end portion of the external frame and the side surface of the flexible display module and has a Young's modulus larger than a Young's modulus of the external frame, wherein
    the housing includes a bending axis serving as a starting point of bending,
    the side surface includes a first side surface and a second side surface not intersecting with the bending axis in plan view, and a third side surface and a fourth side surface intersecting with the bending axis in plan view,
    the internal frame includes a first portion facing the first side surface, a second portion facing the second side surface, a third portion facing the third side surface, and a fourth portion facing the fourth side surface, and
    the first portion and the second portion are fixed to the housing.

2. The display device according to claim 1, further comprising:
    a cover member which includes a third surface facing the second surface and a fourth surface opposite to the third surface, and covers the second surface, wherein
    the external frame has the Young's modulus smaller than a Young's modulus of the cover member.

3. The display device according to claim 2, wherein
    the edge portion is bonded to the fourth surface via a first adhesive layer, and
    the cover member is bonded to the second surface via a second adhesive layer.

4. The display device according to claim 1, wherein the internal frame surrounds the display module in plan view.

5. The display device according to claim 1, wherein the third portion and the fourth portion are slidable with respect to the housing.

6. The display device according to claim 1, wherein
    the base end portion includes a first end portion connected to the housing and a second end portion connected to the edge portion,
    a distance between the first end portion and the first portion is a first distance, and
    a distance between the second end portion and the first portion is a second distance.

7. The display device according to claim 6, wherein the first distance and the second distance are the same.

8. The display device according to claim 6, wherein when the display device is bent with the bending axis as a starting point, the second distance is smaller than the first distance.

9. The display device according to claim 6, wherein when the display device is bent with the bending axis as a starting point, the second distance is larger than the first distance.

* * * * *